(12) United States Patent
Hamazaki

(10) Patent No.: US 7,340,708 B2
(45) Date of Patent: Mar. 4, 2008

(54) METHOD AND APPARATUS FOR GENERATING LAYOUT PATTERN

(75) Inventor: Ryoji Hamazaki, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 151 days.

(21) Appl. No.: 11/362,949

(22) Filed: Feb. 28, 2006

(65) Prior Publication Data

US 2006/0271903 A1 Nov. 30, 2006

(30) Foreign Application Priority Data

May 25, 2005 (JP) ............................. 2005-152011

(51) Int. Cl.
*G06F 17/50* (2006.01)
(52) U.S. Cl. ................. 716/8; 716/11; 716/17
(58) Field of Classification Search ............. 716/8, 716/11, 17
See application file for complete search history.

(56) References Cited

U.S. PATENT DOCUMENTS

2005/0278673 A1* 12/2005 Kawachi ................. 716/8

2006/0045325 A1* 3/2006 Zavadsky et al. ............ 382/145

FOREIGN PATENT DOCUMENTS

| JP | 08-096002 | 4/1996 |
|---|---|---|
| JP | 2000-195958 | 7/2000 |
| JP | 2003-036280 | 2/2003 |

* cited by examiner

*Primary Examiner*—Sun James Lin
(74) *Attorney, Agent, or Firm*—Rabin & Berdo, P.C.

(57) ABSTRACT

A method includes: obtaining process technology definition data related to a process technology of each layer forming a basic cell, from a process technology definition file defining process technology definition data related to a process technology for use in fabricating a semiconductor integrated circuit, thereby holding a process technology definition table; obtaining device structure data including data related to a device template which defines a structure of each layer of the basic cell and data related to the structure of the layer defined in accordance with the device template, from a device structure definition file, thereby holding the obtained device structure data as a device structure definition table; and determining the structure of each layer defined in accordance with the device template held as the obtained device structure data, thereby generating the layout pattern of the basic cell forming the semiconductor integrated circuit.

20 Claims, 25 Drawing Sheets

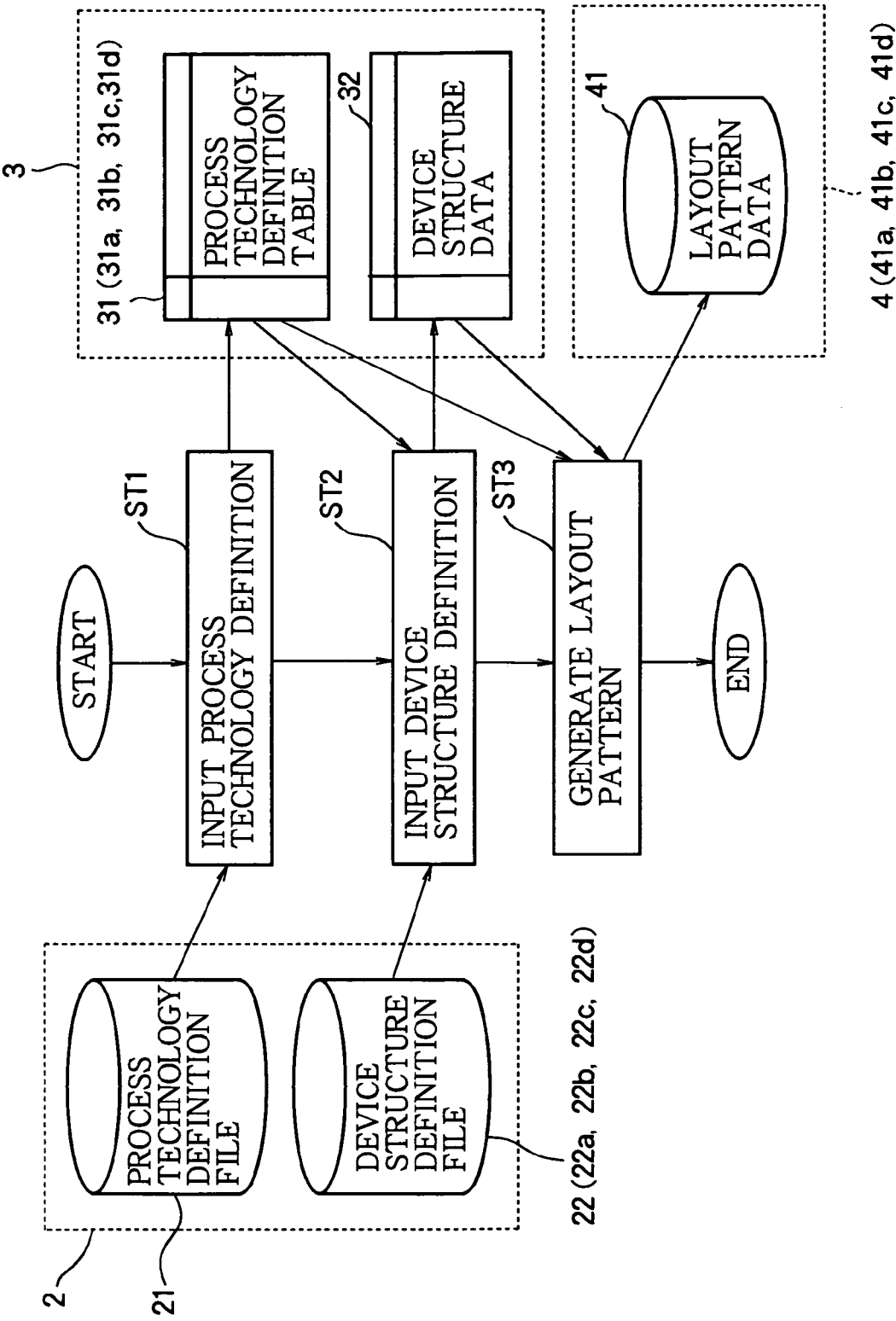

FIG.3

| CONTENTS OF PROCESS TECHNOLOGY DEFINITION FILE | | | PLAN VIEW |
|---|---|---|---|
| (a) MINIMUM WIDTH OF LAYER<br><br>MinimumWidth    layer1 | | size | 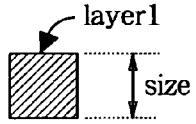 |
| (b) MINIMUM SPACING BETWEEN LAYERS<br><br>MinimumSpacing    layer1<br><br>MinimumSpacing    layer1    layer2 | | size<br><br>size | 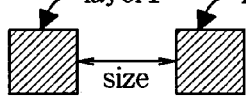 |
| (c) MINIMUM LAYERS OVERLAP MARGIN<br><br>MinimumEnclosure    layer1    layer2 | | size | 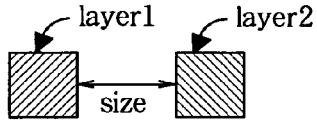 |
| (d) MINIMUM LAYER EXTENSION LENGTH<br><br>MinimumExtension    layer1    layer2 | | size |  |
| (e) MINIMUM LAYERS OVERLAP LENGTH<br><br>MinimumOverlap    layer1    layer2 | | size | 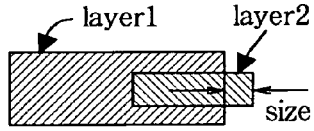 |
| (f) LAYER FORMING UNIT RESISTOR<br><br>SheetResistor    layer1 | | ohm | 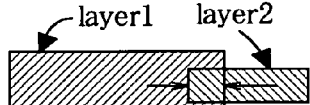 |
| (g) LAYERS FORMING UNIT CAPACITOR<br><br>AreaCapacitor    layer1    layer2 | | farad | 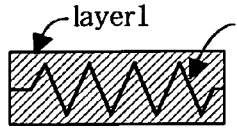 |

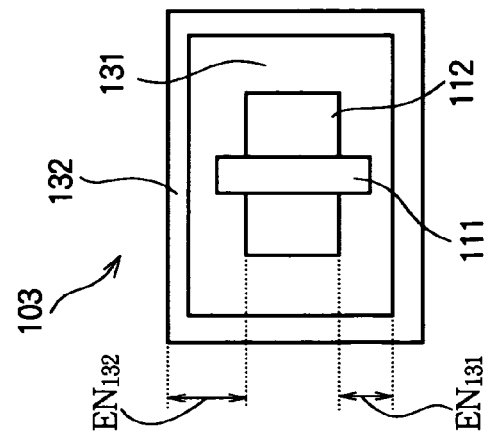
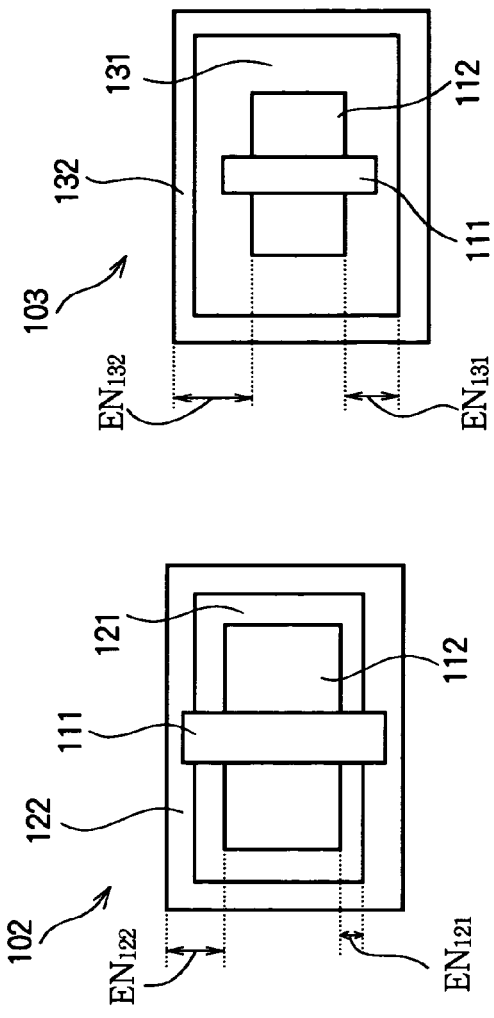
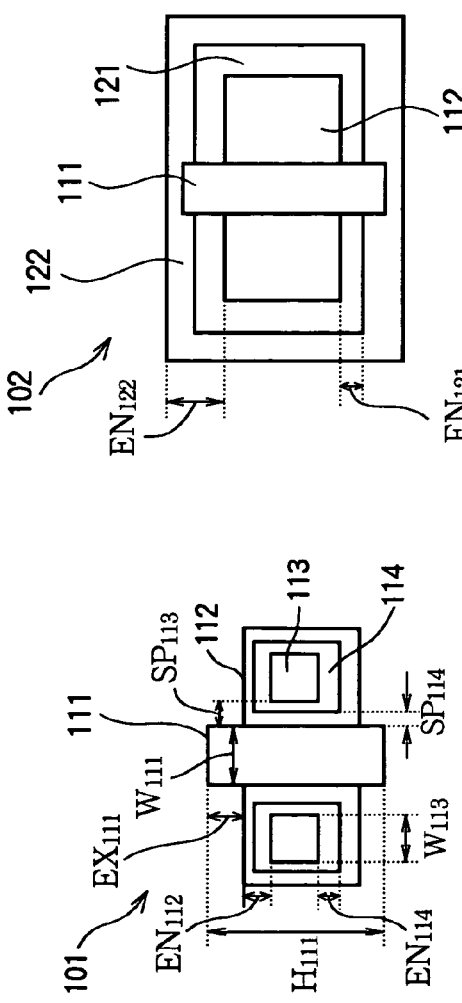
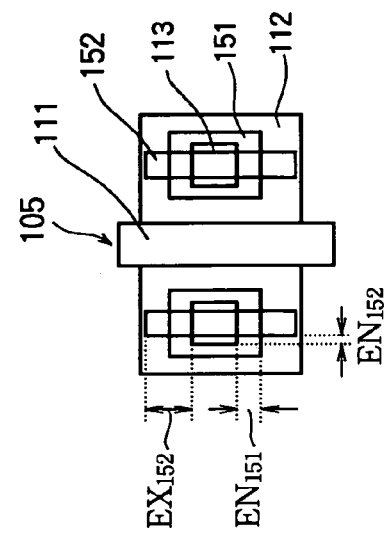
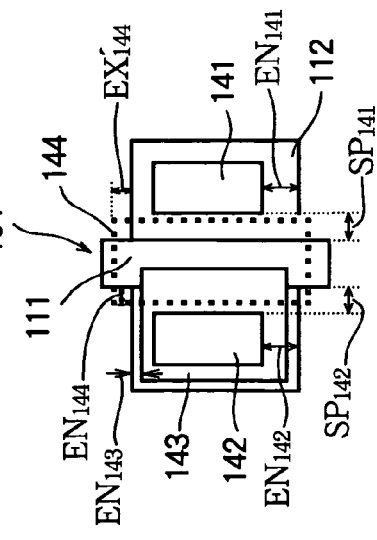

FIG.5

| DEVICE STRUCTURE DEFINITION FILE |
|---|
| (cell=BASIC CELL NAME  deviceType="Transistor"<br>　　　　　　　　　　　gate　　　=GATE LAYER NAME<br>　　　　　　　　　　　active　=ACTIVE LAYER NAME<br>　　　　　　　　　　　contact=CONTACT LAYER NAME<br>　　　　　　　　　　　metal　=METAL LAYER NAME<br>　　　　　　　　　　　[impla　=IMPLANTED LAYER NAME]<br>　　　　　　　　　　　[2ndImpla =2ND IMPLANTED LAYER NAME]<br>　　　　　　　　　　　[well　　=WELL LAYER NAME]<br>　　　　　　　　　　　[2ndWell =2ND WELL LAYER NAME]<br>　　　　　　　　　　　[drainCover =DRAIN COVER LAYER NAME]<br>　　　　　　　　　　　[sourceCover =SOURCE COVER LAYER NAME]<br>　　　　　　　　　　　[2ndSourceCover =2ND SOURCE COVER LAYER NAME]<br>　　　　　　　　　　　[gateCover =GATE COVER LAYER NAME]<br>　　　　　　　　　　　[2ndContact =2ND CONTACT LAYER NAME]<br>　　　　　　　　　　　[contactCover =CONTACT COVER LAYER NAME]<br>　　　　　　　　　　　[minGateWidth =MINIMUM GATE WIDTH]<br>　　　　　　　　　　　[minGateLength =MINIMUM GATE LENGTH]<br>　　　　　　　　　　　[bentGate =PRESENCE/ABSENCE]<br>)... |

22a (*) NOTATIONAL SYSTEM
　[ ]　: OMISSIBLE
　/　: OR

FIG. 6A

PROCESS TECHNOLOGY DEFINITION TABLE — 31a

| | layer1 | layer2 | SIZE |
|---|---|---|---|
| MinimumEnclosure | NDIFF | C2AC | a |
| MinimumWidth | C2AC | | b |
| MinimumSpacing | C2AC | C2AC | c |
| MinimumEnclosure | MET1 | C2AC | d |
| MinimumSpacing | POLY1 | C2AC | e |
| MinimumExtension | NDIFF | POLY1 | f |
| MinimumWidth | POLY1 | | g |
| MinimumWidth | NDIFF | | h |
| MinimumEnclosure | NVT | NDIFF | k |
| MinimumEnclosure | NDIFF | POLY1 | m |

FIG. 6B

DEVICE STRUCTURE DEFINITION TABLE — 32a (cell=nmos3 gate    = POLY1 active  = NDIFF contact = C2AC metal   = MET1 impla   = NVT minGateWidth  = hh minGateLength = gg  )

FIG. 8

PARAMETERS OF TRANSISTOR DEVICE ⌐41a

| PARAMATER NAME | DESCRIPTION |
|---|---|
| Gate Width | GATE WIDTH |
| Gate Length | GATE LENGTH |
| Gate Splitting | SPECIFY GATE SPLITTING |
| Split Type | GATE SPLIT TYPE IN GATE SPLITTING<br><Finger>SPECIFY NUMBER OF SPLITTING OF GATE WIDTH<br><Threshold>SPECIFY SPLIT GATE WIDTH |
| Fingers | NUMBER OF SPLITTING OF GATE |
| Threshold | GATE WIDTH OF GATE SPLITTING |
| Right Contact | CONTROL WHETHER OR NOT RIGHT CONTACT IS PRODUCED |
| Right Contact Coverage | RATIO OF PRODUCED RIGHT CONTACT |
| Right Contact Position | COMPRESSION DIRECTION WHEN RATIO OF NUMBER OF RIGHT CONTACT IS LESS THAN 100% |
| Center Contact | CONTROL WHETHER OR NOT CENTER CONTACT IS PRODUCED |
| Center Contact Coverage | RATIO OF PRODUCED CENTER CONTACT |
| Center Contact Position | COMPRESSION DIRECTION WHEN RATIO OF NUMBER OF CENTER CONTACT IS LESS THAN 100% |
| Left Contact | CONTROL WHETHER OR NOT LEFT CONTACT IS PRODUCED |
| Left Contact Coverage | RATIO OF PRODUCED LEFT CONTACT |
| Left Contact Position | COMPRESSION DIRECTION WHEN RATIO OF NUMBER OF LEFT CONTACT IS LESS THAN 100% |
| Source Contact Gate Spacing | SPACING BETWEEN CONTACT AND GATE ON SOURCE TERMINAL |
| Drain Contact Gate Spacing | SPACING BETWEEN CONTACT AND GATE ON DRAIN TERMINAL |

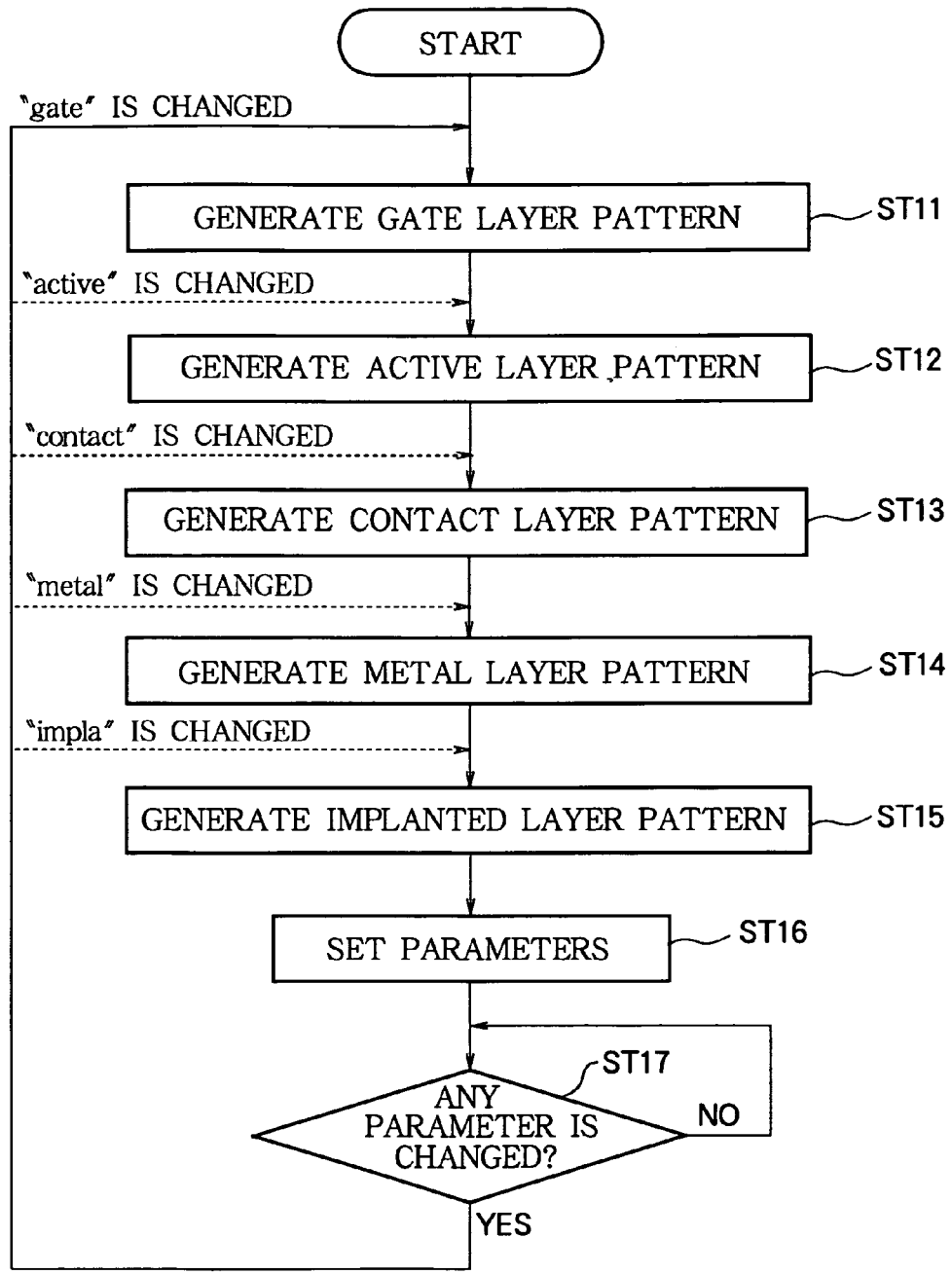

FIG.11

| DEVICE STRUCTURE DEFINITION FILE OF RESISTOR |
|---|

```
(cell=BASIC CELL NAME
         deviceType      = "Resistor"
         resistor        = RESISTOR LAYER NAME
         contact         = CONTACT LAYER NAME
         metal           = METAL LAYER NAME
         recognition     = RESISTOR RECOGNITION LAYER NAME
         [impla          = IMPLANTED LAYER NAME]
         [2ndImpla       = 2ND IMPLANTED LAYER NAME]
         [well           = WELL LAYER NAME]
         [2ndWell        = 2ND WELL LAYER NAME]
         [2ndContact     = 2ND CONTACT LAYER NAME]
         [activeContact  = ACTIVE CONTACT LAYER NAME]
         [guardringAcitve = GUARD RING ACTIVE LAYER NAME]
                [guardringContact = GUARD RING CONTACT LAYER NAME]
                [guardringImpla   = GUARD RING IMPLANTED LAYER NAME]
         ]
         [resCover       = RESISTOR COVER LAYER NAME]
         [resSealed      = RESISTOR SEALED PRESENCE / ABSENSE]
         [minResWidth    = MINIMUM RESISTOR WIDTH]
)...
```

(*) NOTATIONAL SYSTEM
  [ ] : OMISSIBLE
  /   : OR

| PROCESS TECHNOLOGY DEFINITION TABLE | | | |
|---|---|---|---|
| | layer1 | layer2 | SIZE OR ohm |
| MunimumWidh | POLY1 | | p |
| MunimumEnclosure | POLY1 | C2G1 | n |
| MunimumWidth | C2G1 | | x |
| MunimumEnclosure | MET1 | C2G1 | r |
| MunimumEnclosure | PX1 | POLY1 | s |
| MunimumExtension | RES2 | RES1 | t |
| MunimumEnclosure | RES1 | POLY1 | u |
| MunimumEnclosure | RES2 | RES1 | v |
| MunimumSpacing | MET1 | | w |
| SheetResistor | POLY1 | | R |

| DEVICE STRUCTURE DEFINITION TABLE |
|---|
| (cell=poly |
|     deviceType = "Resistor" |
|     resistor     = POLY1 |
|     contact      = C2G1 |
|     metal        = MET1 |
|     recognition  = RES1 |
|     impla        = RX1 |
|     resCover    = RES2 |
|     resSealed   = t |
|     minResWidth = XX |
|     minResLength = L) |

FIG.13

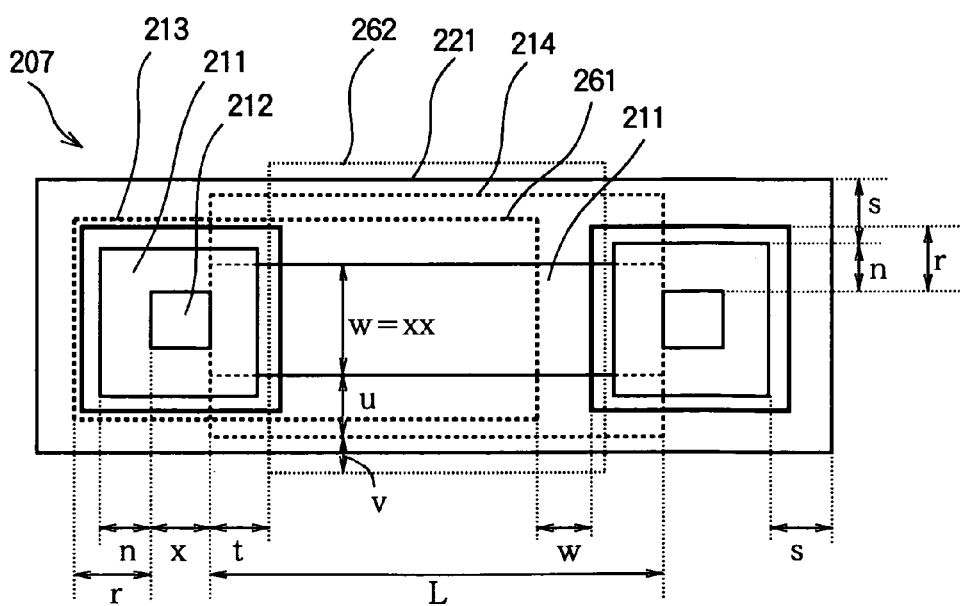

| PARAMETER NAME | PARAMETERS OF RESISTOR DEVICE | |
|---|---|---|
| | DESCRIPTION | |
| Resistor Width | RESISTOR WIDTH | |
| Resistor Length | RESISTOR LENGTH | |
| Resistance | RESISTANCE VALUE | |
| Resistance Type | RESISTOR SHAPE TYPE | |
| | <Pile> DRAWING WITH DIVISION AND PILE | |
| | <Serpentine> DRAWING WITH A SINGLE SERPENTINE STROKE | |
| Size Specify Type | RESISTOR SPECIFY TYPE | |
| | <Length & Width> SPECIFY RESISTOR WIDTH AND RESISTOR LENGTH | |
| | <Resistance & width> SPECIFY RESISTOR VALUE AND RESISTOR WIDTH | |
| | <Resistance & Length> SPECIFY RESISTOR VALUE AND RESISTOR LENGTH | |
| Number of Segment | NUMBER OF DIVISIONS AND BENDS OF RESISTOR SEGMENT | |
| Segment Spacing | SPACING BETWEEN DIVIDED RESISTOR SEGMENTS | |

FIG.17

| DEVICE STRUCTURE DEFINITION FILE OF CAPACITOR |
|---|

```
(cell=BASIC CELL NAME  deviceType    ="Capacitor"
                       top           = TOP  LAYER NAME
                       bottom        = BOTTOM LAYER NAME
                       contact       = CONTACT LAYER NAME
                       metal         = METAL LAYER NAME
                       [3rdCap       = 3RD CAPACITOR LAYER NAME
                       [impla        = IMPLANTED LAYER NAME
                       [2ndImpla     = 2ND IMPLANTED LAYER NAME
                       [capCover     = CAPACITOR COVER LAYER NAME
                       [well         = WELL LAYER NAME
                       [2ndWell]     = 2ND WELL LAYER NAME
                       [2ndContact   = 2ND CONTACT LAYER NAME
                       [contactCover = CONTACT COVER LAYER NAME
                       [minTopWidth  = MINIMUM CAPACITOR WIDTH
)...
```

(*) NOTATIONAL SYSTEM
   [ ] : OMISSIBLE
   / : OR

PROCESS TECHNOLOGY DEFINITION TABLE

| | layer1 | layer2 | SIZE OR farad |
|---|---|---|---|
| MunimumEnclosure | NDIFF | C2AC | ca |
| MunimumEnclosure | MET1 | C2AC | cb |
| MunimumSpacing | POLY1 | C2AC | cc |
| MunimumWidth | POLY1 | | cd |
| MunimumEnclosure | C2M2 | C2AC | ce |
| MunimumWidth | C2AC | | cf |
| MunimumSpacing | C2AC | | cg |
| MunimumEnclosure | NVT | NDIFF | ch |
| MunimumEnclosure | WELL | NDIFF | cj |
| MunimumWidth | C2M2 | | ck |
| MunimumSpacing | C2M2 | | cm |
| AreaCapacitor | NDIFF | POLY1 | F |

DEVICE STRUCTURE DEFINITION TABLE

```
(cell=ncap3
    deviceType = "Capacitor"
    top         = NDIFF
    bottom      = POLY1
    contact     = C2AC
    metal       = MET1
    impla       = NVT
    well        = WELL
    2ndContact  = C2M2
    minCapWidth = cwh  )
```

FIG.20

PARAMETER OF CAPACITOR DEVICE — 41c

| PARAMETER NAME | DESCRIPTION |
|---|---|
| Capacitor Width | CAPACITOR WIDTH |
| Capacitor Heigh | CAPACITOR HEIGHT |
| Capacitance | CAPACITANCE |
| Size Specify Type | CAPASITOR SPECIFY TYPE |
| | <Width &Height> SPECIFY CAPACITOR WIDTH AND CAPACITOR HEIGHT |
| | <Capacitance &Width> SPECIFY CAPACITANCE AND CAPACITOR WIDTH |
| | <Capacitance &Height> SPECIFY CAPACITANCE AND CAPACITOR HEIGHT |

FIG.23

DEVICE STRUCTURE DEFINITION FILE 22d

```
(cell=BASIC CELL NAME  deviceType       ="Inductor"
                       shapeType         = SHAPE TYPE(SQUARE/OCTAGON/CIRCLE)
                       inductor          = INDUCTOR LAYER NAME
                       [defaultWidth]    = PASS WIDTH
                       [defaultSpacing]  = SPACING BETWEEN PATHS]
                       [defaultDiameter] = INNER DIAMETER]
                       [defaultRoll]     = NUMBER OF WINDINGS]
)...
```

(*) NOTATIONAL SYSTEM
   [ ] : OMISSIBLE
   / : OR

PROCESS TECHNOLOGY DEFINITION TABLE — 31d

| | layer | SIZE |
|---|---|---|
| MunimumWidth | MET1 | dx |
| MunimumSpacing | MET1 | ds |

DEVICE STRUCTURE DEFINITION TABLE — 32d

```
(cell=octinductor
    deviceType = "Inductor"
    shapeType  = OCTAGON
    Inductor   = MET1
    defaultWidth    = dw
    defultDiameter  = dl
    defaultRoll     = 2.5
```

FIG.26

| PARAMETERS OF INDUCTOR DEVICE ||
|---|---|
| PARAMETER NAME | DESCRIPTION |
| Width | PATH WIDTH OF INDUCTOR |
| Spacing | PATHS SPACING OF INDUCTOR |
| Diameter | INNER DIAMETER OF PATH OF INDUCTOR |
| Roll | NUMBER OF WINDINGS OF INDUCTOR |

41d

METHOD AND APPARATUS FOR GENERATING LAYOUT PATTERN

BACKGROUND OF THE INVENTION

1. Field of the Invention

The present invention relates to a method and an apparatus for generating a layout pattern of a semiconductor device (a basic cell), for use in designing a layout of a semiconductor integrated circuit.

2. Description of the Related Art

A variety of layout design methods, i.e., a variety of layout drawing methods using a layout drawing apparatus, have been proposed for use in designing a layout of a semiconductor integrated circuit. See the Japanese Patent Application Kokai (Laid-Open) Publication No. 8-96002 (patent document 1), the Japanese Patent Application Kokai (Laid-Open) Publication No. 2000-195958 (patent document 2), and the Japanese Patent Application Kokai (Laid-Open) Publication No. 2003-36280 (patent document 3), for instance.

Representative examples are methods 1 to 3 given below.

Method 1: All layout patterns that would be needed in the layout design phase are drawn in advance and stored. These layout patterns are used to design a layout of a semiconductor integrated circuit.

Method 2: Basic layout patterns are drawn in advance and stored. In the layout design phase, a size of the basic layout pattern is changed to create a desired layout pattern, and the desired layout pattern is used to design a layout of a semiconductor integrated circuit.

Method 3: Basic layout patterns are drawn in advance and stored. Size-changeable items of the basic layout patterns are specified as parameters. In the layout design phase, the parameter value is specified to change a size of the basic layout pattern to create a desired layout pattern. The desired layout pattern is used to design the layout of a semiconductor integrated circuit.

The method 1 described above requires humans to draw all the layout patterns that would be needed, by using a drawing apparatus. Since a great number of layout patterns must be drawn, there is a high probability that a drawing error is included in the layout patterns.

The methods 2 and 3 require humans to draw a basic layout pattern beforehand by using a drawing apparatus and also require manual input of a parameter value for changing a size of the basic layout pattern. There is a probability of a basic layout pattern drawing error or a parameter value input error, causing an error to be included in a layout pattern generated on the basis of the basic layout pattern.

The layout patterns used in the phase of designing the layout of a semiconductor integrated circuit depend on the process technology used in the fabrication of the semiconductor integrated circuit. Accordingly, the method 1 described above requires the layout patterns to be drawn and stored for each process technology, and the methods 2 and 3 described above require basic layout patterns to be drawn and stored for each process technology. In both cases, a large number of layout patterns must be drawn beforehand, and the work requires much effort and time.

In addition, since the layout patterns used in designing the layout of a semiconductor integrated circuit depend on the process technology for use in fabricating the semiconductor integrated circuit, a change in the process technology requires humans to change the layout patterns by using a drawing apparatus in the method 1 described above. In the methods 2 and 3 described above, humans must change the basic layout patterns and desired layout patterns generated on the basis of the basic layout patterns by using a drawing apparatus. Each time the process technology is changed, much effort and time must be expended in any method.

SUMMARY OF THE INVENTION

It is an object of the present invention to provide a method and an apparatus for generating a layout pattern that enable an appropriate layout pattern to be automatically generated with a reduced amount of effort in a short time.

According to the present invention, a method for generating a layout pattern of a basic cell forming a semiconductor integrated circuit, includes: obtaining process technology definition data related to a process technology of each layer forming the basic cell as an object in which the layout pattern is generated, from a process technology definition file defining process technology definition data related to a process technology for use in fabricating a semiconductor integrated circuit, thereby holding a process technology definition table containing the obtained process technology definition data; obtaining device structure data including data related to a device template which defines a structure of each layer of the basic cell as an object in which the layout pattern is generated and data related to the structure of the layer defined in accordance with the device template, from a device structure definition file defining the device structure data determined for each type of the basic cell forming the semiconductor integrated circuit, thereby holding the obtained device structure data as a device structure definition table; and determining the structure of each layer defined in accordance with the device template held as the obtained device structure data, in accordance with the process technology definition data of a corresponding layer in the process technology definition table, thereby generating the layout pattern of the basic cell forming the semiconductor integrated circuit.

According to the present invention, an apparatus for generating a layout pattern of a basic cell forming a semiconductor integrated circuit, includes: a first storage for storing a process technology definition file defining process technology definition data related to a process technology for use in fabricating a semiconductor integrated circuit; a second storage for storing a process technology definition table containing the process technology definition data related to the process technology of each layer forming the basic cell as an object in which the layout pattern is generated, the process technology definition data being obtained from the process technology definition file stored in the first storage; a third storage for storing a device structure definition file defining device structure data determined for each type of the basic cell forming the semiconductor integrated circuit, the device structure data including data related to a device template which defines a structure of each layer of the basic cell and data related to the structure of the layer defined in accordance with the device template; a fourth storage for storing the device structure data as a device structure definition table, the device structure data including data related to a device template which defines a structure of each layer of the basic cell as an object in which the layout pattern is generated and data related to the structure of the layer defined in accordance with the device template; and a data processor determining the structure of each layer defined in accordance with the device template held as the obtained device structure data, in accordance with the obtained process technology definition data of a corresponding layer in the process technology definition table, thereby generating the layout pattern of the basic cell forming the semiconductor integrated circuit.

According to the present invention, data related to the process technology of each layer of a basic cell are obtained from a process technology definition file and are held as a process technology definition table; data related to the structure of each layer and a device template are obtained from a device structure definition file and are held as device structure data; and the structure of each layer defined in accordance with the device template is determined on the basis of the data related to the process technology of the corresponding layer in the process technology definition table. Therefore, a layout pattern is automatically generated, and an appropriate layout pattern can be generated quickly with a reduced amount of effort and without the probability of a human operation error.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 2 is a diagram including a flow chart illustrating the layout pattern generation method according to any of the first to fourth embodiments;

FIG. 3 is a diagram showing contents (sample process technology definitions) of a process technology definition file to be used in the layout pattern generation method according to any of the first to fourth embodiments;

FIGS. 4A to 4E are diagrams showing contents (sample templates) included in a device structure definition file to be used in the layout pattern generation method according to the first embodiment;

FIG. 5 is a diagram showing contents (layer names of layer structures of a device template) of the device structure definition file used in the layout pattern generation method according to the first embodiment;

FIG. 6A is a diagram showing contents (layer names, minimum sizes, etc.) of the process technology definition table used in the layout pattern generation method according to the first embodiment, and FIG. 6B is a diagram showing contents (the layer names of layer structures of the transistor device) of the device structure definition table used in the layout pattern generation method according to the first embodiment;

FIG. 8 is a diagram showing parameters of a layout pattern of the transistor device generated by the layout pattern generation method of the first embodiment;

FIG. 9 is a flow chart showing a layout pattern generation process in the layout pattern generation method according to the first embodiment;

FIG. 11 is a diagram showing contents (layer names of layer structures of the device template) of the device structure definition file used in the layout pattern generation method according to the second embodiment;

FIG. 12A is a diagram showing contents (layer names, minimum sizes, etc.) of the process technology definition table used in the layout pattern generation method according to the second embodiment, and FIG. 12B is a diagram showing contents (layer names of layer structures of the resistor device) of the device structure definition table used in the layout pattern generation method according to the second embodiment;

FIG. 13 is a diagram showing a layout pattern of a resistor device generated by the layout pattern generation method according to the second embodiment;

FIG. 14 is a diagram showing parameters of a layout pattern of a resistor device generated by the layout pattern generation method according to the second embodiment;

FIG. 17 is a diagram showing contents (layer names of layer structures of a device template) of a device structure definition file used in the layout pattern generation method according to the third embodiment;

FIG. 18A is a diagram showing contents (layer names, minimum size, capacitance, etc.) of the process technology definition table used in the layout pattern generation method according to the third embodiment, and FIG. 18B is a diagram showing contents (layer names and size of layer structures of a capacitor device) of the device structure definition table used in the layout pattern generation method according to the third embodiment;

FIG. 20 is a diagram showing parameters of the layout pattern of the capacitor device generated by the layout pattern generation method according to the third embodiment;

FIG. 23 is a diagram showing contents (layer names of layer structures of a device template) of the device structure definition file used in the layout pattern generation method according to the fourth embodiment;

FIG. 26 is a diagram showing parameters of the layout pattern of an inductor device generated by the layout pattern generation method according to the fourth embodiment.

DETAILED DESCRIPTION OF THE INVENTION

Further scope of applicability of the present invention will become apparent from the detailed description given hereinafter. However, it should be understood that the detailed description and specific examples, while indicating preferred embodiments of the invention, are given by way of illustration only, since various changes and modifications will become apparent to those skilled in the art from the detailed description.

Figure 1:
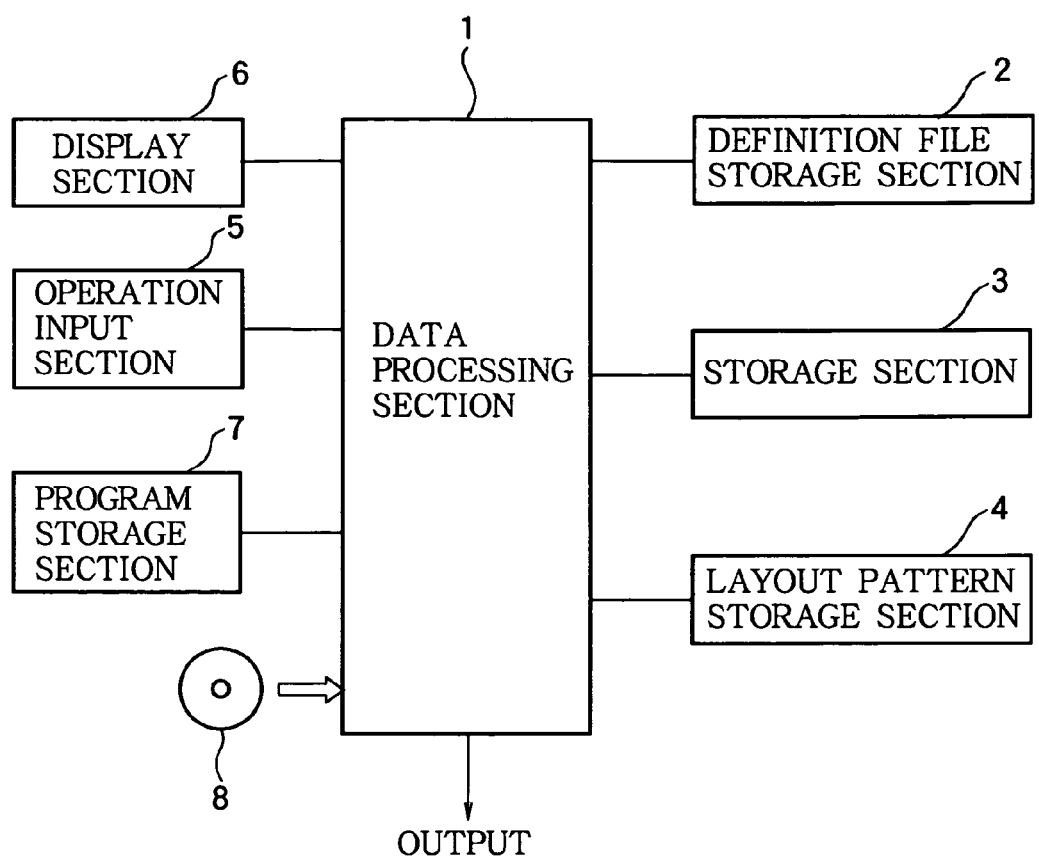
FIG. 1 is a block diagram schematically showing a configuration of an apparatus implementing a layout pattern generation method according to any of first to fourth embodiments of the present invention, i.e., a layout pattern generation apparatus according to any of the first to fourth embodiments.

FIG. 1 is a block diagram schematically showing a configuration of an apparatus implementing a layout pattern generation method according to any of the first to fourth embodiments of the present invention, i.e., a layout pattern generation apparatus according to any of the first to fourth embodiments.

The layout pattern generation apparatus shown in FIG. 1 is an apparatus for generating a layout pattern of a semiconductor device (a basic cell), i.e., a layout pattern drawing apparatus for use in designing a layout of a semiconductor device formed on a semiconductor substrate for fabricating a semiconductor integrated circuit device, or drawing the layout of the semiconductor integrated circuit. The layout pattern generation apparatus shown in FIG. 1 includes a data processing section 1 such as a CPU, a definition file storage section 2 such as a hard disk drive, a storage section 3 such as a memory, a layout pattern storage section 4 such as a hard disk drive, an operation input section 5 such as a keyboard and/or a mouse, a display section 6 such as a liquid-crystal monitor, and a program storage section 7 for storing an installed program, such as a hard disk drive. The layout pattern generation apparatus shown FIG. 1 is a computer system which operates in accordance with an installed program, for instance. The program of the layout pattern generation apparatus can be installed from an information recording medium 8 such as an optical disk recording a program to be installed. The definition file storage section 2, the layout pattern storage section 4, and the program storage section 7 may be included in separate hard disk drives or in different recording regions of a single hard disk drive.

FIG. 2 is a diagram including a flow chart illustrating the layout pattern generation method according to any of the first to fourth embodiments.

As shown in FIG. 2, the definition file storage section 2 stores a process technology definition file 21 defining data related to a process technology for use in fabricating a semiconductor integrated circuit. The definition file storage section 2 also stores a device structure definition file 22 defining data related to a divide structure specified for each type of basic cell including a semiconductor integrated circuit.

As shown in FIG. 2, the storage section 3 stores data related to the process technology of each layer forming the basic cell of the layout pattern to be generated, obtained from the process technology definition file 21, as a process technology definition table 31. In addition, the storage section 3 stores a device template for use in defining the structure of the layer of the basic cell of the layout pattern to be generated and data concerning the structure of the layer defined in accordance with the device template (a device structure definition table), obtained from the device structure definition file 22, as device structure data 32.

Further, the layout pattern storage section 4 stores the data of the generated layout pattern and parameters for controlling the layout pattern, as layout pattern data 41.

As shown in FIG. 2, the layout pattern generation method according to any of the first to fourth embodiments is carried out in steps ST1 to ST3. In process technology definition input step ST1, data related to the process technology of each layer forming the basic cell of the layout pattern to be generated is obtained from the process technology definition file 21, which defines data related to the process technologies for use in fabricating the semiconductor integrated circuit, and the data is held as the process technology definition table 31. In device structure definition input step ST2, a device template with which the structure of each layer of the basic cell of the layout pattern to be generated and data concerning the structure of each layer defined in accordance with the device template are obtained from the device structure definition file 22, which defines data concerning the device structure determined for each basic cell type forming the semiconductor integrated circuit, and the data is held as the device structure data 32. In layout pattern generation step ST3, the layout pattern of the basic cell forming the semiconductor integrated circuit is generated by determining the structure of each layer defined in accordance with the device template held as the device structure data 32 on the basis of the data concerning the process technology of the corresponding layer in the process technology definition table.

FIG. 3 is a diagram showing contents of the process technology definition file 21 used in the layout pattern generation method according to any of the first to fourth embodiments.

As shown in FIG. 3, the process technology definition file 21 defines conditions to be satisfied by each layer forming the basic cells of a semiconductor integrated circuit, such as a transistor device, a resistor device, a capacitor device, and an inductor device. The process technology definition file 21 defines a size of each layer forming the basic cell of the semiconductor integrated circuit (layer 1 in FIG. 3) and a positional relationship between layers (layers 1 and 2 in FIG. 3). The size of each layer and the positional relationship between layers form a drawing standard (i.e., a drawing rule) in the layout pattern generation method. As shown in FIG. 3, the process technology definition file 21 contains some or all of the following items: a minimum width of each layer forming the basic cell ("MinimumWidth" in a row (a)); a minimum spacing between layers forming the basic cell ("MinimumSpacing" in a row (b)), a minimum overlap margin ("MinimumEnclosure" in a row (c)), a minimum extension length ("MinimumExtension" in a row (d)), and a minimum overlap length ("MinimumOverlap" in a row (e)), of the layers forming the basic cell and overlapping one another; a layer structure forming a unit resistor of the basic cell ("SheetResistor" in a row (f)), and a layer structure forming a unit capacitor of the basic cell ("AreaCapacitor" in a row (g)). FIG. 3 shows an example of the process technology definition file 21. The actual process technology definition file 21 contains the data of all layers of the layout pattern of each possible basic cell.

First Embodiment

In the first embodiment, a case where a basic cell as an object, in which a layout pattern is generated or changed, is a transistor device will be described.

FIGS. 4A to 4E are diagrams showing sample device templates included in the device structure definition file to be used in the layout pattern generation method according to the first embodiment. As shown in FIGS. 4A to 4E, the device templates are divided into two types: a basic structure that is absolutely needed to generate the layout pattern of the transistor device (FIG. 4A) and an optional structure that are needed depending on the type of the transistor device (FIGS. 4B to 4E).

A device template 101 of the basic structure shown in FIG. 4A includes a gate layer (also referred to as "gate") 111, an active layer (also referred to as "active") 112, a contact layer (also referred to as "contact") 113, and a metal layer (also referred to as "metal") 114.

The width (e.g., $W_{111}$ in FIG. 4A) of the gate layer 111 is the minimum width of the layer forming the gate layer 111, i.e., "MinimumWidth" of the corresponding layer in a process technology definition table 31a, which will be described later. The height (e.g., $H_{111}$ in FIG. 4A) of the gate layer 111 is given by expression (1) below:

$$H_{111} = W_{111} + (EX_{111} \times 2) \tag{1}$$

where $EX_{111}$ is the minimum extension size of the gate layer 111 from the active layer 112, i.e., "MinimumExtension" of the corresponding layer in the process technology definition table, which will be described later.

The width (e.g., $W_{113}$ in FIG. 4A) of the contact layer 113 is the minimum width of the layers forming the contact layer 113, i.e., "MinimumWidth" of the corresponding layer in the process technology definition table 31a, which will be described later. The overlap margin (e.g., $EN_{114}$ in FIG. 4A) of the metal layer 114 is determined by the minimum margin of overlap among the layers forming the contact layer 113, i.e., "MinimumEnclosure" of the corresponding layer in the process technology definition table 31a, which will be described later. The contact layer 113 and the metal layer 114 are disposed symmetrically with leaving the minimum spacing (e.g., $SP_{113}$ and $SP_{114}$ in FIG. 4A) of the layers forming the gate layer 111 and contact layer 113 from the side of the gate layer 111. The overlap margin (e.g., $EN_{112}$ in FIG. 4A) of the active layer 112 with respect to the contact layer 113 is determined by the minimum overlap margin of the layers forming the contact layer 113, i.e., "MinimumEnclosure" of the corresponding layer in the process technology definition table 31a.

A device template 102 of an implantation structure shown in FIG. 4B includes a gate layer 111, an active layer 112, an ion implanted layer, i.e., ion implantation layer (also referred to as "impla") 121, a second ion implanted layer (also referred to as "2ndImpla") 122. The overlap margins (e.g., $EN_{121}$ and $EN_{122}$ in FIG. 4B) of the ion implanted layer 121 and the second ion implanted layer 121 are determined by the minimum overlap margins forming the active layer 112, i.e., "MinimumEnclosure" of the corresponding layer in the process technology definition table 31a, which will be described later.

A device template 103 of a well structure shown in FIG. 4C includes a gate layer 111, an active layer 112, a well layer (also referred to as "well") 131, and a second well layer (also referred to as "2ndWell") 132. The overlap margins (e.g., $EN_{131}$ and $EN_{132}$ in FIG. 4C) of the well layer "well" 131 and the second well layer "2ndWell" 132 with respect to the active layer 112 are determined by the minimum overlap margin, i.e., "MinimumEnclosure" of the corresponding layer in the process technology definition table 31a, which will be described later, based on the active layer 112.

A device template 104 of a terminal cover structure shown in FIG. 4D includes a gate layer 111, an active layer 112, a drain cover layer (also referred to as "drainCover") 141, a source cover layer (also referred to as "sourceCover") 142, a second source cover layer (also referred to as "2ndSourceCover") 143, and a gate cover layer (also referred to as "gateCover") 144. The spacings (e.g., $SP_{141}$ and $SP_{142}$ in FIG. 4D) between the drain cover layer "drainCover" 141 and the gate layer 111 and between the source cover layer "sourceCover" 142 and the gate layer 111 are determined by the minimum spacing of the layers forming the gate layer 111. The overlap margins (e.g., $EN_{141}$ and $EN_{142}$ in FIG. 4D) of the drain cover layer "drainCover" 141 and the source cover layer "sourceCover" 142 with respect to the active layer 112 are determined by the minimum overlap margin of the layers forming the active layer 112, i.e., "MinimumEnclosure" of the corresponding layer in the process technology definition table 31a, which will be described later. The position of the second source cover layer "2ndSourceCover" 143 is defined by the central position of the gate layer 111, and the overlap margin (e.g., $EN_{143}$ in FIG. 4D) of the second source cover layer "2ndSourceCover" 143 is determined by the minimum overlap margin of the layers forming the active layer 112, i.e., "MinimumEnclosure" of the corresponding layer in the process technology definition table 31a, which will be described later. The overlap margin (e.g., $EN_{144}$ in FIG. 4D) of the gate cover layer 144 with respect to the gate layer 111 is determined by the minimum overlap margin of the layers forming the gate layer 111, i.e., "MinimumEnclosure" of the corresponding layer in the process technology definition table 31a, which will be described later, and the extension size (e.g., $EX_{144}$ in FIG. 4D) of the gate cover layer 144 is determined by the minimum extension size of the layers forming the active layer 112, i.e., "MinimumExtension" of the corresponding layer in the process technology definition table 31a, which will be described later.

A device template 105 of a contact structure shown in FIG. 4E includes a gate layer 111, an active layer 112, a contact layer 113, a second contact layer (also referred to as "2ndContact") 151, and a contact cover layer (also referred to as "contactCover") 152. The overlap margin (e.g., $EN_{151}$ in FIG. 4E) of the second contact layer "2ndContact" 151 is determined by the minimum overlap margin of the layers forming the contact layer 113, i.e., "MinimumEnclosure" in the corresponding layer in the process technology definition table 31a, which will be described later. The extension size (e.g., $EX_{152}$ in FIG. 4E) of the contact cover layer "contactCover" 152 is determined by the minimum extension size of the layers forming the contact layer 113, i.e., "MinimumExtension" of the corresponding layer of the process technology definition table 31a, which will be described later. The overlap margin (e.g., $EN_{152}$ in FIG. 4E) of the contact cover layer "contactCover" 152 with respect to the contact layer 113 is determined by the minimum overlap margin of the layers forming the contact layer 113 of the contact cover layer "contactCover" 152, i.e., "MinimumEnclosure" of the corresponding layer in the process technology definition table 31a, which will be described later.

FIG. 5 is a diagram showing sample contents (e.g., layer names of the layer structures of the device template) of the device structure definition file 22a used in the layout pattern generation method according to the first embodiment, which corresponds to the device structure definition file 22 in FIG. 2.

The device structure definition file 22a shown in FIG. 5 contains the basic cell name to be defined (i.e., deviceType="Transistor") and layer names given to the layer structures of the device template. The layer name is assigned by specifying a layer needed to generate a layout pattern of the basic cell in accordance with the layers included in the device template and specifying a corresponding layer name in accordance with the process technology definition file 21.

Layout patterns having different layer structures and shapes can be defined by selecting a layer forming the transistor device from the device template, specifying the layer in the device structure definition file 22a, and defining the drawing standard of each layer. It is checked in the device structure definition input step (step ST2 in FIG. 2) whether the drawing standard data of a layer name defined in the device structure definition file 22a are included in the process technology definition table 31a, which corresponds to the process technology definition table 31 in FIG. 2.

In the layout pattern generation step (step ST3 in FIG. 2), the layout pattern 41 of the basic cell is generated in the minimum size, and parameters for changing the layout pattern are specified, in accordance with the drawing standard defined in the device structure definition table 32a and the process technology definition table 31a, and they are stored in the layout pattern storage section 4. A basic cell with specified parameters is referred to as a "parameterized cell". When the value of a specified parameter is changed, processing similar to the layout pattern generation is performed in accordance with the value, and all the layout patterns (i.e., graphic data) concerning the changed parameter are changed.

If the process technology of a generated layout pattern is changed, a new layout pattern suited to the changed process technology can be obtained by changing the contents of the process technology definition file 21 and executing again the processing for automatic layout pattern generation.

Figure 7:
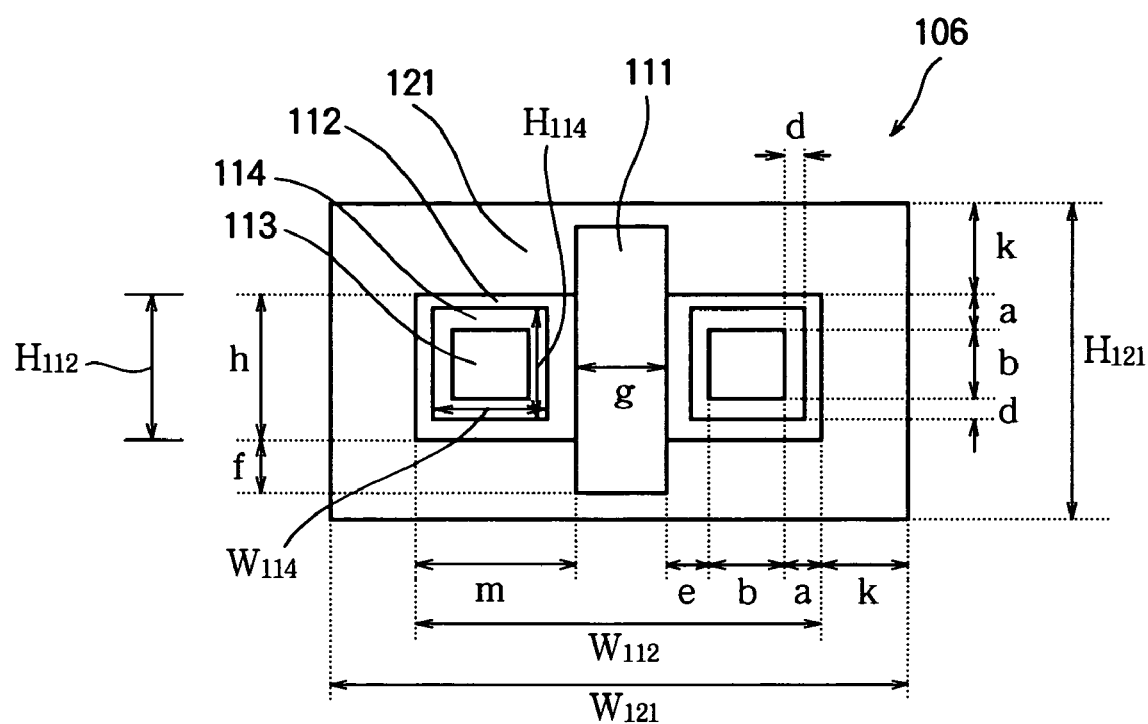
FIG. 7 is a diagram showing a layout pattern of a transistor device generated by the layout pattern generation method according to the first embodiment.

FIG. 6A is a diagram showing contents (e.g., layer names and minimum sizes) of the process technology definition table 31a used in the layout pattern generation method according to the first embodiment, and FIG. 6B is a diagram showing contents (e.g., layer names of layers of the transistor device) of the device structure definition table 32a used in the layout pattern generation method according to the first embodiment. FIG. 7 is a diagram showing a layout pattern 106 of a transistor device generated by the layout pattern generation method according to the first embodiment. FIGS. 6A and 6B and FIG. 7 show examples related to automatic generation of a layout pattern of an NMOS transistor device. POLY1, NDIFF, C2AC, MET1, and NVT in FIGS. 6A and 6B and FIG. 7 are layer names used as symbols representing layer structures associating the process technology definition table 31a and the device structure definition table 32a.

In the layout pattern generation for the basic cell having a cell name of nmos3 (i.e., cell=nmos3), the layout patterns of the basic structure, the implantation structure, the well structure, the terminal cover structure, and the contact structure are generated in that order, in accordance with the device templates of the transistor device (FIGS. 4A to 4E). The layers to be generated are the layers such as the gate layer, the active layer, and the contact layer of the device template of the device defined by the device structure definition table 32a. The size of each layer to be generated and the positional relationship between layers are determined by selecting the size "SIZE" in the layer name (e.g., POLY1, NDIFF, and C2AC) field and drawing standard (e.g., "MinimumEnclosure") field corresponding to the layer (e.g., the gate layer, the active layer, and the contact layer) defined by the device template and the device structure definition table 32a, from the process technology definition table 31a (e.g., selecting any size of a to 'h', 'k', and 'm'). The layers defined by the device structure definition table 32a are generated here, and undefined layers are not generated. The layers of the basic structure must be defined.

First, the gate layer 111 of the basic structure is generated by a POLY1 layer in the process technology definition table 31a. The gate width is specified to a greater value of the minimum width of the POLY1 layer in the process technology definition table 31a (e.g., "MinimumWidth" of POLY1='g') and the minimum gate length defined in the device structure definition table 32a (e.g., "minGateLength"='gg'). In this example, the value 'g' of the process technology definition table 31a is adopted, and the width of the POLY1 layer (i.e., gate layer 111) to be generated is specified to 'g', as shown in FIG. 7.

The gate width of the gate layer 111 (i.e., POLY1 layer) is specified to a greater value of the minimum width (e.g., "MinimumWidth" of NDIFF='h') of the NDIFF layer (i.e., active layer 112) defined in the process technology definition table 31a and the minimum gate width (e.g., minGateWidth='hh') defined in the device structure definition table 32a. In this example, the value 'h' of the process technology definition table 31a is adopted, and the gate width of the gate layer 111 (i.e., POLY1 layer) to be generated is specified to 'h', as shown in FIG. 7.

The extension size of the gate layer 111 with respect to the active layer 112 is specified to double the minimum extension definition ("MinimumExtension" of the POLY1 layer with respect to the NDIFF layer) 'f' defined in the process technology definition table 31a (upper and lower extensions of "MinimumExtension") plus the gate width 'h', i.e., (h+2×f). This value becomes the height of the POLY1 layer to be generated. The drawing of the gate layer 111 is generated accordingly.

Next, the active layer 112 of the basic structure is generated by the NDIFF layer of the process technology definition table 31a. The active layer 112 is generated as determined by expressions (2) and (3) shown below, which give a width $W_{112}$ when one contact each is placed to the left and right of the gate layer 111 and a height $H_{112}$ when one contact layer 113 is placed on the active layer 112, in accordance with the drawing standard of the process technology definition table 31a:

$$W_{112}=g+2\times(e+b+a) \quad (2)$$

$$H_{112}=h \quad (3)$$

where 'g' is the gate length, 'e' is the minimum spacing between the POLY1 and C2AC layers, 'b' is the minimum width of the C2AC layer, 'a' is the minimum overlap margin between the NDIFF and C2AC layers, and 'h' is the gate width. Further, the center of the generated active layer 112 is disposed on the center of the gate layer 111.

Next, the contact layer 113 of the basic structure is generated in accordance with the C2AC layer in the process technology definition table 31a shown in FIG. 6A. The width and height of the contact layer 113 are specified to the minimum width 'b' of the C2AC layer in the process technology definition table 31a shown in FIG. 6A. The contact layer 113 is generated to the left and right of the gate layer 111, leaving the minimum overlap margin of 'b' between the NDIFF layer and the C2AC layer in the process technology definition table 31a as the spacing between the base of the contact layer 113 and the base of the active layer 112. The left and right contact layers 113 are disposed in such positions that the spacings between the left side of the gate layer 111 and the right side of the contact layer 113 and between the right side of the gate layer 111 and the left side of the contact layer 113 are the minimum spacing of 'e' between the POLY1 and C2AC layers in the process technology definition table 31a. The number $N_{112}$ of the contact layers 113 to be generated is the greatest possible number of layers that can be disposed in the height $H_{112}$ and the size of the active layer 112, satisfying the drawing standard. The number $N_{112}$ of the contact layers 113 that can be generated is given by the expression (4) below:

$$N_{112}=(H_{112}-a+c)/(b+c) \quad (4)$$

where 'a' is the minimum overlap margin between the NDIFF and C2AC layers, 'c' is the minimum spacing between the C2AC layers, and 'b' is the minimum width of the C2AC layer.

Next, the metal layer 114 of the basic structure is generated in accordance with the MET1 layer of the process technology definition table 31a shown in FIG. 6A. The metal layer 114 is generated with the width $W_{114}$ and the height $H_{114}$ as given by the expressions (5) and (6) below and is disposed at the center of all the generated contact layers 113.

$$W_{114}=\{(\text{minimum layer width 'b' of } C2AC)+(\text{overlap margin 'd' between } MET1 \text{ and } C2AC)\}\times 2=b+d\times 2 \quad (5)$$

$$\{H_{114}=\{(\text{top } Y \text{ coordinate of the highest contact layer})-(\text{bottom } Y \text{ coordinate of the lowest contact layer})\}+(\text{overlap margin 'd' between } MET1 \text{ and } C2AC)\}\times 2=b+d\times 2 \quad (6)$$

Then, the ion implanted layer 121 of the implantation structure is generated in accordance with the NVT layer in the process technology definition table 31a. The ion implanted layer 121 is generated with the width $W_{121}$ and height $H_{121}$ as given by the expressions (7) and (8) below, and is disposed with its center placed at the center of the active layer 112.

$$W_{121}=W_{112}+2\times k \quad (7)$$

$$H_{121}=h+2\times k \quad (8)$$

where $W_{112}$ is the width of the active layer 112, 'k' is the minimum overlap margin between the NVT and NDIFF layers, 'h' is the height of the active layer 112.

The layout pattern generation for an NMOS transistor according to the first embodiment is completed. If the device structure definition table 32a has definitions of the well structure, terminal cover structure, and contact structure as well, those layer structures are generated in the way as described above. The reference pattern of layer generation of the well structure is the active layer 112. The reference patterns of layer generation of the terminal cover structure are the gate layer 111, the source cover layer "sourceCover" 142, and the drain cover layer "draincover" 141 with respect to the gate cover layer "gatecover" 144. The reference patterns of layer generation of the terminal cover structure are the gate layer 111 and active layer 112 with respect to the second source cover layer "2ndSourceCover" 143. The reference patterns of layer generation of the contact structure are the gate layer 111 and active layer 112 with respect to the second contact layer "2ndContact" 151 and the contact layer 113 with respect to the contact cover layer "contactCover" 152. As has been described above, all of the layers to be generated, their reference patterns, and drawing standards are controlled by the process technology definition table 31a, and the layout pattern of the basic cell is automatically generated in accordance with the drawing standard.

Then, parameters are automatically specified for the generated layout pattern of the basic cell. A parameter includes a parameter name and a parameter value. It is programmed to start layout pattern generation immediately when a parameter is changed. When a basic cell is generated, the default parameter values are the minimum values specified in the process technology definition table 31a. FIG. 8 is a diagram showing examples of parameters 41a of the layout pattern of the transistor device. If the layout is designed by using a basic cell, the shape of the layout pattern can be changed by changing a parameter value specified for the basic cell. For example, if the basic cell of the NMOS transistor device shown in FIG. 7 is placed and if the gate width parameter is changed, automatic layout pattern generation is performed, the height of the gate layer 111 of the basic structure of the device template is changed, and the height of the active layer 112 using the gate width as the reference is changed. Then, the number of contact layers 113 calculated from the height of the active layer 112, the height of the metal layer 114 calculated from the spacing between the highest and lowest contact layers 113, and the height of the ion implanted layer 121 based on the active layer 112 of the ion implanted layer 121 are changed in that order. When another specified parameter is changed, patterns using a changed pattern as a reference pattern are changed successively, and a desired layout pattern is provided.

FIG. 9 is a flow chart showing an example of layout pattern generation (step ST3 in FIG. 2) in the layout pattern generation method according to the first embodiment. As has been described with reference to FIG. 3 to FIG. 8, in the layout pattern generation step ST3 of the layout pattern generation method according to the first embodiment, the gate layer pattern is generated in step ST11, the active layer pattern is generated in step ST12, the contact layer pattern is generated in step ST13, the metal layer pattern is generated in step ST14, the implanted layer pattern is generated in step ST15, and parameters are specified in step ST16. If any parameter is changed later in step ST17, the layer pattern generation is performed from the step of the corresponding pattern.

As has been described above, according to the first embodiment, necessary data is obtained from the process technology definition file 21 defining the drawing standard based on the process technology related to the fabrication of the basic cell, necessary device structure data is obtained from the device structure definition file 22a defining the device structure of the basic cell,.and the patterns of the defined layers are automatically generated in accordance with the device template. Therefore, the layout pattern of the basic cell can be automatically generated without breaking the drawing standard, and the efficiency of layout design can be improved.

Further, in the first embodiment, since the layout patterns of the basic cells of different device structures can be generated just by changing the device structure data 32 obtained from the device structure definition file 22a, each device structure does not require a special automatic layout pattern generation program. Since the program development for each device structure is unnecessary, the layout patterns of devices can be generated early, enabling layout design to be started at an early stage.

Furthermore, when a process for use in fabricating a semiconductor integrated circuit device is ported and a change to the drawing standard is needed, the layout pattern is automatically changed by changing the process technology definition file 21 and executing again the layout pattern generation. Therefore, the efficiency of porting the layout pattern process can be improved.

In addition, since a layout pattern satisfying the drawing standard can be automatically changed by the values of parameters specified in the basic cell of the transistor to be generated, the manpower needed to change the layout pattern can be reduced.

Second Embodiment

In a second embodiment, a case where a basic cell as an object, in which a layout pattern is generated, is a resistor device will be described. In the second embodiment, the layout pattern of the resistor device can be automatically generated or changed by a method similar to the layout pattern generation method according to the first embodiment.

In the layout pattern generation method according to the second embodiment, the definition contents in the process technology definition file (21 in FIG. 2) are replaced with new definition contents of a resistor device file, and the new definition contents can be used to generate a layout pattern of the resistor device. In the process technology definition file (21 in FIG. 2), a drawing standard of a layer, a drawing standard between layers, a unit resistance of the resistor layer (layer structure "SheetResistor" forming the unit resistor of the basic cell in the row (f) of FIG. 3)-are created for all the layers forming the layout pattern of the basic cell of a resistor device.

In the device structure definition file (22 in FIG. 2), a layer in which the basic cell of the resistor device is generated is assigned a corresponding layer name in the process technology definition file, and the layer structure of the resistor device is defined, on the basis of the device template of the resistor device taking all processes into consideration.

FIGS. 10A to 10F are diagrams showing contents (sample device templates) of a device structure definition file used in the layout pattern generation method according to the second embodiment. As shown in FIGS. 10A to 10F, the device templates are divided into two types: a basic structure,(FIG. 10A) that is absolutely-necessary for generating a layout pattern of a resistor device and optional structures (FIGS. 10B to 10F) that are needed depending on the type of the resistor device.

Figure 10A:
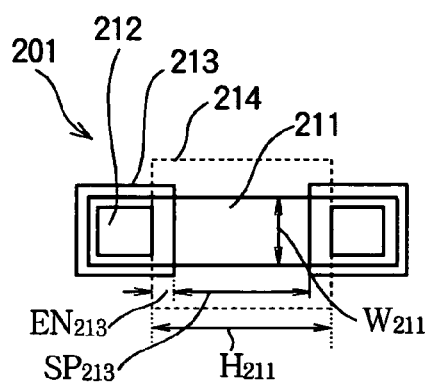
FIGS. 10A to 10F are diagrams showing contents (sample device templates) of a device structure definition file used in the layout pattern generation method according to the second embodiment.

A device template 201 of the basic structure shown in FIG. 10A includes a resistor layer (also referred to as "resistor") 211, a contact layer (also referred to as "contact") 212, a metal layer (also referred to as "metal") 213, and a resistor recognition layer (also referred to as "recognition") 214.

The width (e.g., $W_{211}$ in FIG. 10A) of the resistor layer 211 is determined by the minimum width of the layer forming the resistor layer 211. The height (e.g., $H_{211}$ in FIG. 10A) of the resistor layer 211 is given by expression (9) below:

$$H_{211}=SP_{213}+(EN_{213}\times 2) \quad (9)$$

where $SP_{213}$ is the minimum spacing of the metal layer 213, and $EN_{213}$ is the minimum overlap margin of the metal layer 213 with respect to the contact layer 212.

A contact layer 212 of the minimum width of the contact structure is disposed at each end of the resistor layer 211. The patterns of the metal layer 213 and the resistor layer 211 are formed to have the minimum overlap margin of the pattern of the contact layer 212. The pattern of the resistor recognition layer 214 is formed with the length specified to the spacing between the inner sides of the contact layers 212 provided at both ends and the width allowing the overlap margin with respect to the resistor layer 211.

Figure 10B:
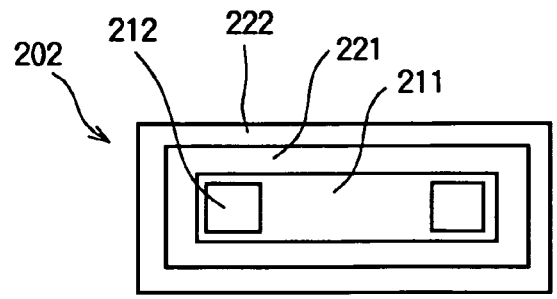

A device template 202 of the implantation structure shown in FIG. 10B has an ion implanted layer 221 and a second ion implanted layer 222, using the pattern of the resistor layer 211 as their reference, leaving the minimum overlap margin with respect to the resistor layer 211.

Figure 10C:
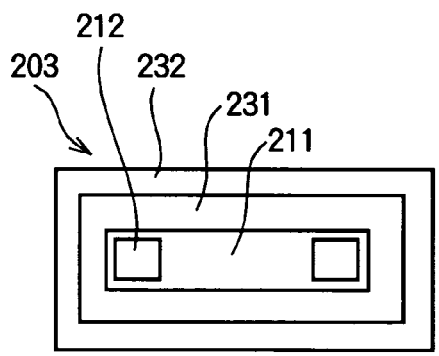

A device template 203 of the well structure shown in FIG. 10C has a well layer 231 and a second well layer 232 using the pattern of the resistor layer 211 as their reference, leaving the minimum overlap margin with respect to the resistor layer 211.

Figure 10D:
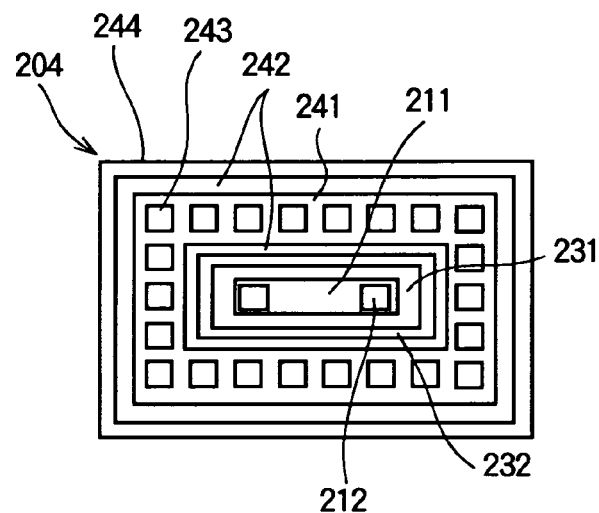

A device template 204 of a guard ring structure for the resistor layer shown in FIG. 10D has a guard ring structure (i.e., guard ring path pattern) placed around a resistor layer 211 leaving a minimum spacing between them. The guard ring path pattern has a guard ring active layer (also referred to as "guardringActive") 241, a guard ring ion implanted layer (also referred to as "guardringImpla") 242 formed with reference to the guard ring active layer 241, a metal layer. 213 (not shown in FIG. 10D), and a guard ring contact layer (also referred to as "guardringContact") 243. If the guard ring active layer "guardringActive" 241 and the guard ring contact layer "guardringcontact" 243 are defined, the metal layer 213 is generated in accordance with the metal layer 213 of the basic structure in FIG. 10A. When the guard ring structure is used, the guard ring ion implanted layer 242 can be omitted, but the other layers must be defined.

Figure 10E:
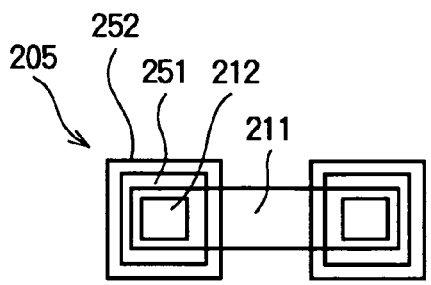

A device template 205 of the contact structure shown in FIG. 10E refers to the patterns of the contact layer 212 disposed at both ends of the resistor layer 211, and has second contact layer 251 and an active contact layer (also referred to as "activeContact1") 252 placed leaving the minimum overlap margin with respect to the contact layer 212.

Figure 10F:
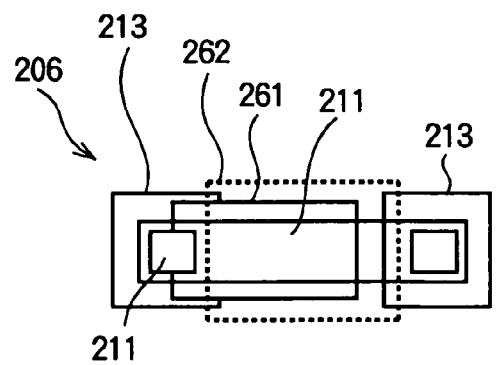

A device template 206 of the cover structure shown in FIG. 10F refers to the patterns of the resistor layer 211 and the contact layer 212, and has a resistor cover layer (also referred to as "resCover") 262 and a resistor sealed layer (also-referred to as "resSealed") 261. The resistor cover layer 262 is determined by the minimum spacing with the pattern of the contact layer 212 and the minimum overlap margin with the resistor layer 211, and resistor sealed layer 261 is determined by the minimum spacing of the metal layer 213 and the minimum overlap margin of the pattern of the resistor layer 211, on the same layer as the metal layer 213.

The structure of the basic cell of the resistor device is defined with the device templates described above. The shape of the layout pattern is determined by the process technology, and the layout pattern is automatically generated.

FIG. 11 is a diagram showing an example of contents (layer names of layer structures of the device template) of the device structure definition file 22b, which corresponds to the device structure definition file 22 shown in FIG. 2, used in the layout pattern generation method according to the second embodiment.

The device structure definition file 22b shown in FIG. 11 includes a basic cell name to be defined (i.e., deviceType="Resistor") and layer names assigned to the layer structures of the device template. The layer name is assigned by specifying a layer required to generate the layout pattern of the basic cell in accordance with the layers included in the device template and specifying the corresponding layer name from the process technology definition file 21.

FIG. 12A is a diagram showing contents (e.g., layer names and minimum sizes) of the process technology definition table 31b used in the layout pattern generation method according to the second embodiment. FIG. 12B is a diagram showing contents (the layers of the resistor device and the layer names of the resistor device) of the device structure definition table 32b used in the layout pattern generation method according to the second embodiment. FIG. 13 is a diagram showing a layout pattern 207 of a resistor device generated by the layout pattern generation method according to the second embodiment. FIGS. 12A and 12B and FIG. 13 shows an example of automatic layout pattern generation of a polyresistor device. POLY1, C2G1, MET1, RES1, RX1, RES2, NDIFF, C2AC, MET1, and NVT in FIGS. 12A and 12B and FIG. 13 are layer names to be used as symbols representing layer configurations associating the process technology definition table 31b and the device structure definition table 32b.

In the layout pattern generation for the basic cell having a cell name of "poly" (i.e., cell=poly), the layout patterns of the basic structure, the implantation structure, the well structure, the guard ring structure, the contact structure, and the cover structure are generated in that order, in accordance with the device templates of the resistor device (FIGS. 10A to 10F). The layers of the device templates (e.g., a resistor layer, a contact layer, a metal layer, a recognition layer, an ion implanted layer, a resistor cover layer, and a resistor sealed layer) of the devices defined in the device structure definition table 32b are generated. The size of each layer to be generated and the positional relationship between layers are determined by selecting a layer name (e.g., POLY1 or C2G1) corresponding to the layer defined by the device template and the device structure definition table 32b and the size of the drawing standard (e.g., "MinimumEnclosure"), from the process technology definition table 31b (e.g., selecting any size of 'n', 'p', and 'r' to 'x'). Layers defined in the device structure definition table 32b are generated here, and an undefined layer is not generated. The layers of the basic structure must be defined.

The resistor layer 211, the contact layer 212, the metal layer 213, and the resistor recognition layer 214 of the basic structure are generated in accordance with layer names POLY1, C2G1, MET1, and RES1 of the process technology definition table 31b respectively. The width and length of the pattern of the resistor layer POLY1 are given by the expressions (10) and (11). MAX(m1, m2) means the maximum value of the values in the parentheses.

(Width of resistor layer)=MAX($XX$, $p$) (10)

(Length of resistor layer)=MAX{$L$, ($w+r\times2$), ($n\times2$)} (11)

where '$XX$' is the "minResWidth" value, '$p$' is the minimum width of the POLY1 layer, '$L$' is the "minResLength" value, '$w$' is the minimum spacing of the MET1 layer, '$r$' is the minimum overlap margin between the MET1 and C2G1 layers, and '$n$' is the minimum overlap margin between the POLY1 and C2G1 layers.

The resistance of the resistor device is calculated from the width and length of the resistor and the unit resistance "SheetResistor" value 'R' of the process technology definition table, and the value is specified as a parameter of the basic cell. All the patterns are created in the minimum size, without breaking the drawing standard.

Next, the pattern of the contact 212 (C2G1 layer) is generated with a width and height determined by the minimum width 'x' of the contact 212 (C2G1 layer). A pattern of the POLY1 layer is generated with the width and height given by the following expression (12), and is placed in the center of the pattern of the contact layer 212.

(Width or height of POLY1 layer pattern of contact
layer 212)=$x+n\times2$ (12)

where '$x$' is the minimum width of the C2G1 layer, and '$n$' is the minimum overlap margin between the POLY1 and C2G1 layers.

Then, a pattern of the metal layer (MET1 layer) 213 is generated with a value given by the expression (13) below, and is placed in the center of the pattern of the contact layer "contact" 212.

(Width or height of MET1 layer pattern of contact
layer 212)=i $x+r\times2$ (13)

where '$x$' is the minimum width of C2G1, and '$r$' is the minimum overlap margin between MET1 and C2G1.

The created patterns of the C2G1 layer, POLY1 layer, and MET1 layer are disposed at either end of the resistor layer (POLY1 layer) 212 in such a manner that the patterns of the contact layer (C2G1 layer) 212 come into contact with each other.

The pattern of the recognition layer (RES1 layer) 214 is generated with values given by the expressions (14) and (15) below, and is placed at the center of the pattern of the POLY1 layer.

(Length of RES1 layer pattern)=(Length of resistor
layer) (14)

(Width of RES1 layer pattern)=(width of resistor
layer)+$u\times2$ (15)

where '$u$' is the minimum overlap margin between the RES1 and POLY1 layers.

The ion implanted layer (RX1 layer) 221 of the implantation structure is generated next. The reference patterns are the resistor layer 211 and the POLY pattern disposed on the contact layer 712. A pattern generated from those patterns is enlarged by the minimum overlap margin 's' between the RX1 and POLY1 layers, and the center of the resistor layer 211 is placed on the center of the pattern of the ion implanted layer 221.

Patterns of the well structure and the guard ring structure are generated next. The reference patterns are the POLY1 pattern. The well layer and the second well layer are generated in accordance with the minimum overlap margin of the POLY1 pattern. The guard ring active layer "guardringActive" 241, the guard ring ion implanted layer "guardringtImpla" 242, the guard ring contact layer "guardringContact" 243, and the guard ring metal layer "guardringMetal" of the guard ring structure are determined by the minimum width of "guardringContact", the minimum overlap margin between "guardringActive" and "guardringContact", the minimum overlap margin between "guardringImpla" and "guardringActive", the minimum overlap margin between "guardringImpla" and "guardringContact", and the minimum overlap margin between "metal" and "guardringContact", and the guard ring path pattern is generated around the resistor pattern leaving the minimum spacing of the resistor. This example of device structure definition skips generation because the layers are not defined.

Next, a contact structure pattern is generated next. The reference pattern is a pattern of the contact layer "contact" 712. The pattern is generated in accordance with the minimum overlap margin with POLY1 and the minimum width of the contact layer 712 and is disposed in the center of the left and right patterns of the contact layer 712. This example of device definition skips generation because the layers are not defined.

Finally, a cover structure pattern is generated. The resistor sealed layer 261 specifies whether the resistor layer "resistor" 711 is sealed by a metal layer, and the reference pattern is the metal layer of the basic structure. The width of the MET1 pattern of the resistor sealed layer 261 is set to the same value as the width of the MET1 layer on the C2G1 layer, and the length is set to the value given by the expressions (16) and (17). The pattern is disposed so that the left side is placed on the left side of the left contact (MET1) layer.

(Length of *MET*1 layer pattern for sealed)=$L+x-w$ (16)

(Width of *MET*1 layer for sealed)=(width of *MET*1 layer pattern of contact) (17)

where 'L' is the length of the resistor layer, 'x' is the minimum width of the contact layer (C2G1), and 'w' is the minimum spacing of the MET1 layers.

The resistor cover layer 262 uses the resistor recognition layer 214 as a reference pattern. The width and length of a RES2 layer pattern to be generated is given by the expressions (18) and (19) and is placed in the center of the resistor recognition layer or the RES1 layer.

(Width of *RES*2 layer pattern)=(width of *RES*1)+ ($v\times 2$) (18)

(Length of *RES*2 layer pattern)=(length of *RES*1)− ($t\times 2$) (19)

where 'v' is the minimum overlap margin between the RES2 and RES1 layers, and 't' is the minimum extension of the RES2 and RES1 layers. With this processing, a layout pattern of the polyresistor device is automatically generated.

Next, parameters are automatically specified for the generated basic cell of the resistor device. A parameter has a parameter name and a parameter value. It is programmed to start layout pattern generation immediately when a parameter is changed. When a basic cell is generated, the default parameter values are the minimum values specified in the process technology definition table 31a. FIG. 14 shows examples of the parameters 41a of the layout pattern of the resistor device. If the layout is designed by using a basic cell, the shape of the layout pattern can be changed by changing a parameter value specified for the basic cell. For example, if a specified type of resistance calculation is "Resistance&Width" which is a type specifying a resistance and a layer width or "Resistance&Length" which is a type specifying a resistance and a layer height, and if a Resistance parameter value is changed, the value of the resistor length or resistor width is automatically calculated from the sheet resistor value "SheetResistor", a resistor width, or a resistor length of the corresponding resistor layer in the process technology definition table, the calculated value is specified, and the layout pattern of the resistor device is automatically changed in accordance with the new parameter value.

Figure 15:
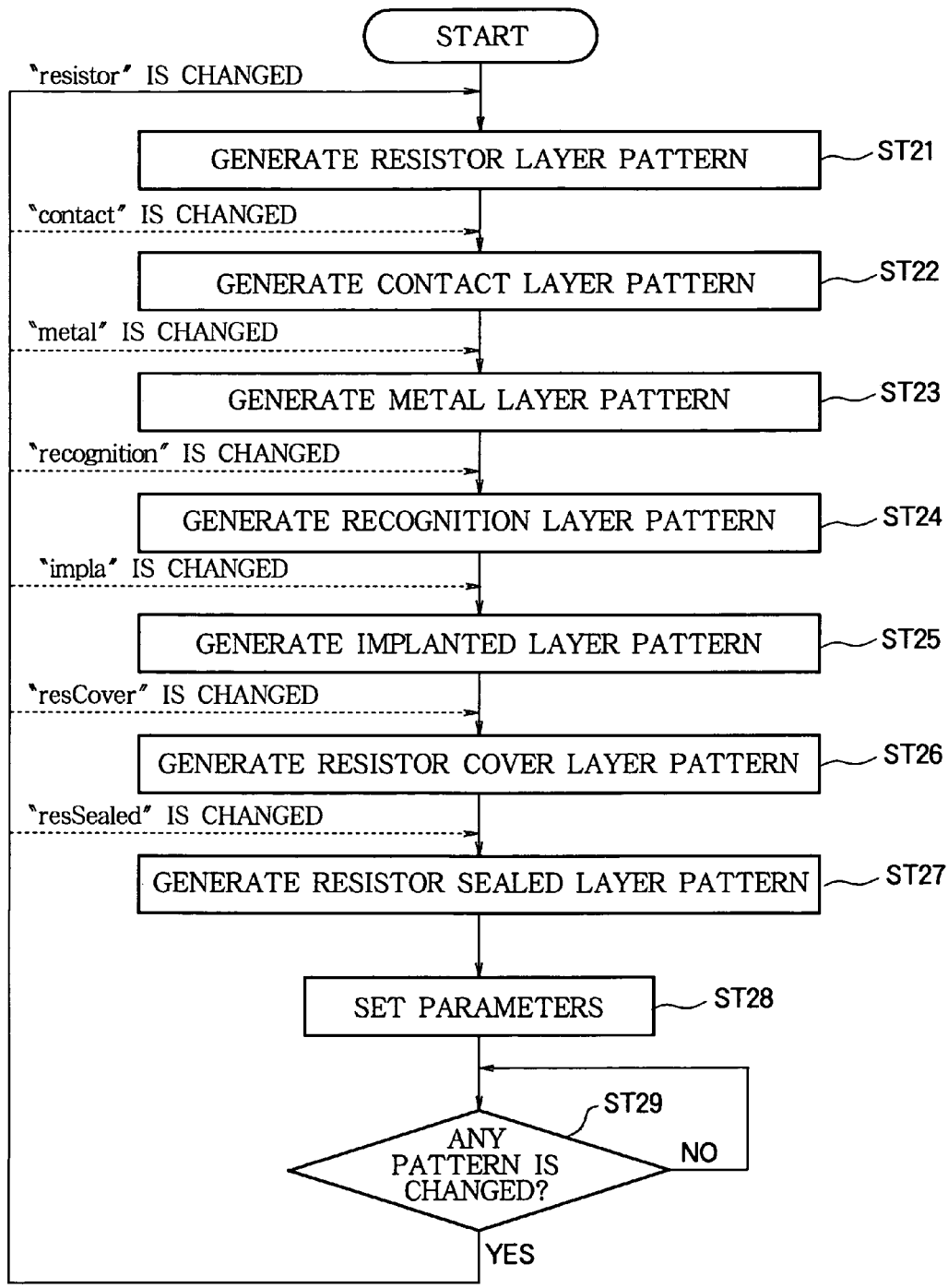
FIG. 15 is a flow chart showing a layout pattern generation process in the layout pattern generation method according to the second embodiment.

FIG. 15 is a flow chart showing an example of the layout pattern generation (step ST3 of FIG. 2) in the layout pattern generation method according to the second embodiment. As has been described above, the resistor layer pattern "resistor" is generated (step ST21), the contact layer pattern "contact" is generated (step ST22), the metal layer pattern "metal" is generated (step ST23), the recognition layer pattern "recognition" is generated (step ST24), the ion implanted layer pattern "impla" is generated (step ST25), the resistor cover layer pattern "resCover" is generated (step ST26), the resistor sealed layer pattern "resSealed" is generated (step ST27), and parameters are specified (step ST28), in layout pattern generation step ST3 of the layout pattern generation method according to the second embodiment. If a parameter is changed later (step ST29), the pattern generation is performed from the step of the corresponding pattern.

As has been described above, according to the second embodiment, necessary data is obtained from the process technology definition file 21 defining the drawing standard based on the process technology related to the fabrication of the basic cell, necessary device structure data 32 are obtained from the device structure definition file 22b defining the device structure of the basic cell, and accordingly the pattern of the defined layer is automatically generated in accordance with device templates. Therefore, the layout pattern of the basic cell can be automatically generated without breaking the drawing standard, and the efficiency of layout design can be improved.

Further, automatic calculation of a resistance from the process technology and automatic calculation of the width and height of a resistor layer pattern from the resistance make it easy to specify parameter values. In addition, automatic correction of the layout can improve the efficiency of layout design.

Furthermore, in the second embodiment, the layout patterns of the basic cells of different device structures can be generated just by changing the device structure data 32 obtained from the device structure definition file 22b, and each device structure does not require a special automatic layout pattern generation program. Since the program development for each device structure is unnecessary, the layout patterns of devices can be generated early, enabling layout design to be started at an early stage.

Moreover, if a drawing standard is changed when a new process is used, the layout pattern can be automatically changed by making a change to the process technology definition file 31 and re-creating the basic cell of the resistor. Therefore, the efficiency of changing the layout pattern is improved.

In addition, since parameters are specified for the basic cell of the resistor and the layout pattern satisfying the drawing standard can be automatically changed by changing a parameter value, the manpower needed to change the layout can be reduced.

Third Embodiment

In the third embodiment, a case where a basic cell as an object, in which a layout pattern is generated, is a capacitor device will be described. In the third embodiment, the layout pattern of the resistor device can be automatically generated or changed in the similar way to in the layout pattern generation method according to the first or second embodiment.

In the layout pattern generation method according to the third embodiment, the definition of the process technology definition file (21 in FIG. 2) is first changed to a capacitor device file, and then the definition can be used to generate a layout pattern of a capacitor device. In the process technology definition file (21 in FIG. 2), a drawing standard of a layer, a drawing standard between layers, and a unit capacitor of the capacitor layer (i.e., a layer structure "AreaCapacitor" forming the unit capacitor of the basic cell in a row (g) of FIG. 3) are created for all the layers forming the layout pattern of the basic cell of the capacitor device.

Next, in the device structure definition file (22 of FIG. 2), a layer of the basic cell of the capacitor device to be generated is assigned a corresponding layer name in the process technology definition file, and the layer configuration of the capacitor device is defined, on the basis of the device templates of the capacitor device taking all processes into consideration.

FIGS. 16A to 16E are diagrams showing examples of device templates in the device structure definition file used in the layout pattern generation method according to the third embodiment. As shown in FIGS. 16A to 16E, the device template includes a basic structure (FIG. 16A) that is absolutely needed to generate a layout pattern of a capacitor device and optional structures (FIGS. 16B to 16E) that are needed depending on the type of the capacitor device.

Figure 16A:
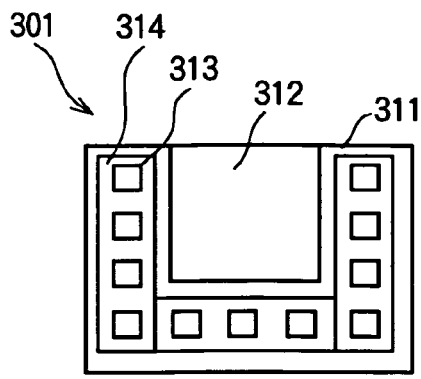
FIGS. 16A to 16E are diagrams showing contents (sample device templates) in the device structure definition file used in the layout pattern generation method according to the third embodiment.

A device template 301 of the basic structure shown in FIG. 16A includes a top layer (also referred to as "top") 311, a bottom layer (also referred to as "bottom") 312, a contact layer (also referred to as "contact") 313, and a metal layer (also referred to as "metal") 314. The bottom layer 312 and the contact layer 313 are created with the minimum width of the corresponding layer. The metal layer 314 is determined by the minimum overlap margin with respect to the contact layer 313. Three sides of the bottom layer 312 are surrounded by a path pattern having the contact layer 313 and the metal layer 314 disposed at intervals of the minimum spacing of the contact layers 313, and the path pattern is disposed with the minimum spacing between the contact layer 313 and the bottom layer 312. The top layer 311 forms a rectangle having the minimum overlap margin with the contact layer 313.

Figure 16B:
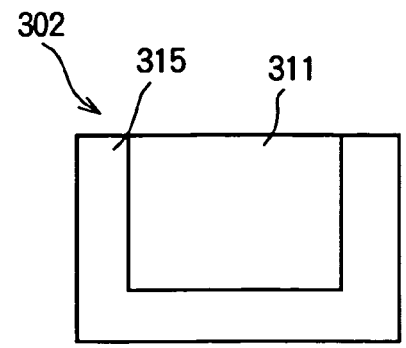

In a device template 302 of a three-layer capacitor structure shown in FIG. 16B, a third capacitor layer (also referred to as "3rdCap") 315 is formed with leaving the minimum overlap margin with respect to (three sides of) the top layer 311.

Figure 16C:
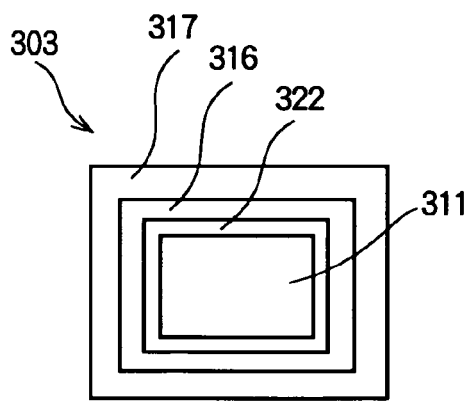

In a device template 303 of an implantation structure shown in FIG. 16C, an ion implanted layer (also referred to as "impla") 316, a second ion implanted layer (also referred to as "2ndImpla") 317, and a capacitor cover layer (also referred to as "capCover") 322 are formed with leaving the minimum overlap margin with respect to the top layer 311.

Figure 16D:
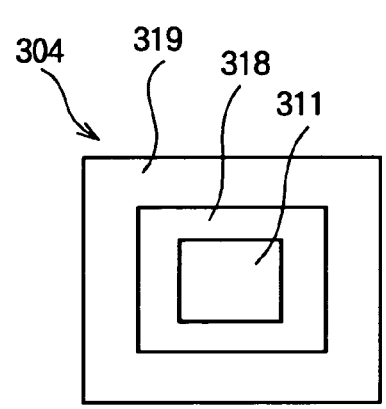

In a device template 304 of a well structure shown in FIG. 16D, a well layer (also referred to as "well") 318 and a second well layer (also referred to as "2ndWell") 319 are formed with leaving the minimum overlap margin with respect to the top layer 311.

Figure 16E:
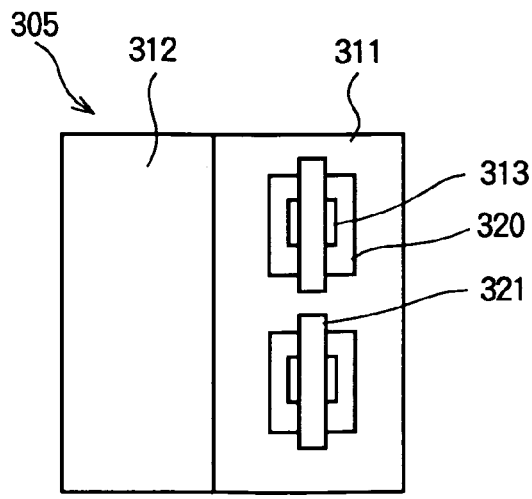

In a device template 305 of a contact structure shown in FIG. 16E, a second contact layer (also referred to as "2ndContact") 320 is formed with leaving the minimum overlap margin with respect to the contact layer 313, and a capacitor cover layer (also referred to as "contactCover") 321 is formed with leaving the minimum extension and the minimum overlap margin with respect to the contact layer 313.

The structure of the basic cell of a capacitor device is defined in accordance with the device templates described above, the shape of the layout pattern is determined by the process technology, and the structure of the basic cell of a capacitor device is automatically generated.

FIG. 17 is a diagram showing examples of contents (layer names of layer structures of a device template) of a device structure definition file 22*c*, which corresponds to the device structure definition file 22 in FIG. 2, used in the layout pattern generation method according to the third embodiment.

The device structure definition file 22*c* shown in FIG. 17 has the basic cell name to be defined (i.e., deviceType="Capacitor") and layer names assigned to layer structures of a device template. A layer name is assigned by specifying a layer needed to generate a layout pattern of the basic cell in accordance with layers included in the device template and specifying a corresponding layer name in the process technology definition file 21. The layout pattern of the basic cell of each capacitor is generated from the defined layer, the assigned layer name, and the drawing standard of the process technology related to the layer name.

Figure 19:
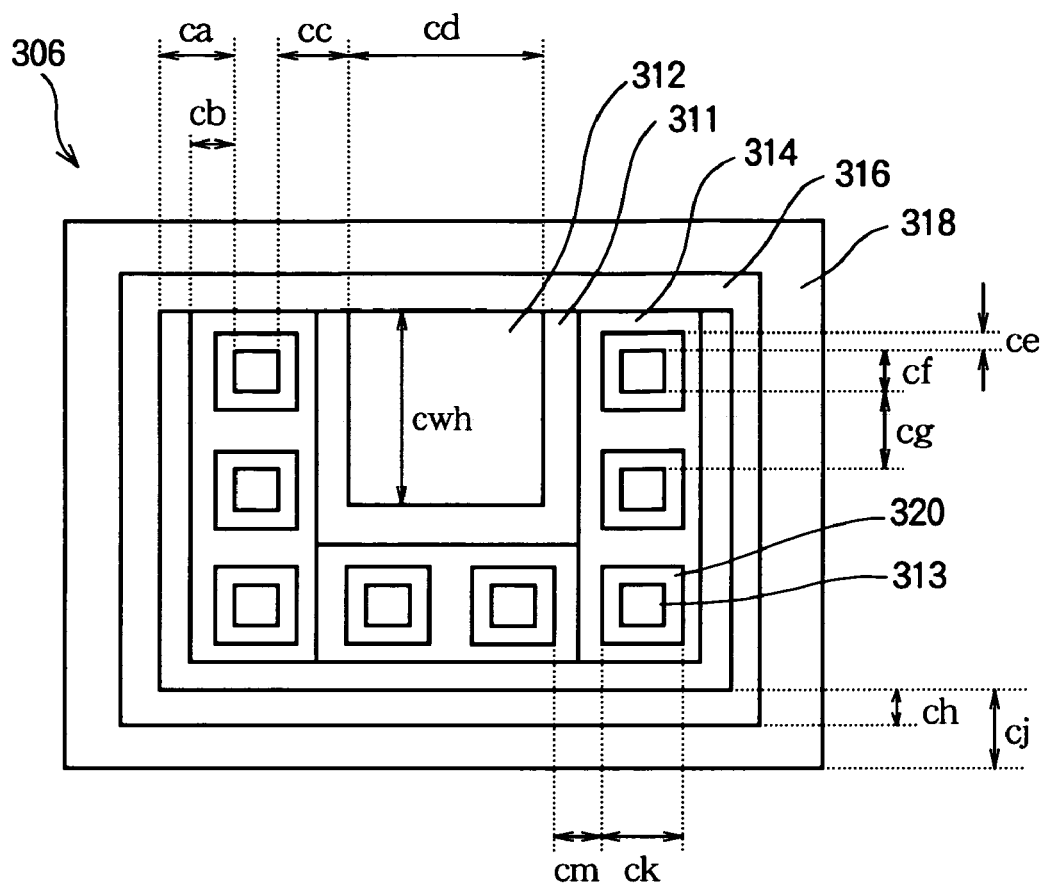
FIG. 19 is a diagram showing a layout pattern of a resistor device generated by the layout pattern generation method according to the third embodiment.

FIG. 18A is a diagram showing contents (e.g., layer names and minimum sizes) of the process technology definition table 31*c* used in the layout pattern generation method according to the third embodiment. FIG. 18B is a diagram showing contents (e.g., layers of a capacitor device and their layer names) of the device structure definition table 32*c* used in the layout pattern generation method according to the third embodiment. FIG. 19 is a diagram showing a layout pattern 306 of a resistor device generated by the layout pattern generation method according to the third embodiment. FIGS. 18A and 18B and FIG. 19 shows examples of the automatic layout pattern generation of a capacitor device. NDIFF, POLY1, C2AC, MET1, NVT, WELL, and C2MC in FIGS. 18A and 18B and FIG. 19 are layer names used as symbols representing layer configurations associating the process technology definition table 31*c* with the device structure definition table 32*c*.

In layout pattern generation of a basic cell having a cell name "ncap3" (i.e., cell=ncap3), the layout patterns are generated for the device templates of a basic structure, a three-layer capacitor structure, an implantation structure, a well structure, and a contact structure (FIGS. 16A to 16E) of a capacitor device in that order. The generated layers are layers (e.g., a top layer, a bottom layer, a contact layer, a metal layer, an ion implanted layer, a well layer, a second contact layer) of the device templates of the device defined in the device structure definition table 32*c* are generated. The size of each of the generated layers and the positional relationship between layers are determined by selecting a layer name (e.g., POLY1 or C2G1) and a size (e.g., 'ca' to 'ch', 'cj', 'ck', and 'cm') in the drawing standard (e.g., "MinimumEnclosure") field from the process technology definition table 31*c*, with respect to the layer defined by the device template and the device structure definition table 32*c*. Layers defined in the device structure definition table 32*c* are generated here, and undefined layers are not generated. The layers of the basic structure must be defined.

First, the top layer 311, the bottom layer 312, the contact layer 313, and the metal layer 314 of the basic structure are formed under layer names NDIFF, POLY1, C2AC, and MET1 respectively. The POLY1 layer of the bottom pattern forming the capacitor layer is generated with its width and height specified to a greater value of the "minCapWidth" value 'cwh' in the device structure definition table 32*c* and the minimum POLY1 width 'cd' defined in the process technology definition table 31*c*. The example shown in FIG. 19 is generated with the "minCapWidth" value 'cwh'. The pattern of the contact layer 313 is the C2AC layer, and the minimum width 'cwh' of the C2AC layer is specified as the width and height of the pattern. A path pattern of the metal layer 314 is formed around three sides of the pattern of the bottom layer 312 leaving the minimum spacing 'cc' between the POLY1 and C2AC layers, with a width allowing the minimum overlap margin 'cd' with respect to the contact layer 313, and the contact layer 313 is disposed at intervals of the minimum spacing 'cg' in the path pattern. Then, the NDIFF layer of the pattern of the top layer 311 is generated with leaving the overlap margin 'ca' with respect to the side of the generated C2AC layer.

In the next process, the three-layer capacitor structure (also referred to as "3rdCap") is generated with the minimum overlap margin with reference to the pattern of the top layer. In this example, however, the structure is not generated because "3rdCap" is not defined.

Then, the ion implanted layer 316, the second ion implanted layer 320, and the capacitor cover layer (also referred to as "capCover") of the implantation structure are generated with the minimum overlap margin, with reference to the pattern of the top layer. In this example, a pattern of the defined ion implanted layer 316 is generated under a name of the NVT layer, leaving the minimum overlap margin 'ch' with respect to the NDIFF layer.

A pattern of the well layer 318 and a second well layer of the well structure are generated with reference to the pattern of the top layer, leaving the minimum overlap margin. In this example, the pattern of the defined well layer is generated under a name of WELL, with leaving the minimum overlap margin 'cj' with respect to the NDIFF layer.

Then, the second contact layer (also referred to as "2ndContact") 320 and a contact cover layer (also referred to as "contactCover") of the contact structure are generated with reference to the pattern of the contact layer. The pattern of the second contact layer is generated under a name of C2MC, with leaving the minimum overlap margin 'ce' with respect to the C2AC layer. The contact cover layer "contactCover" is generated as determined by the minimum overlap margin of the contact layer and the minimum extension of the contact cover layer "contactCover" from the contact layer. In this example, the layer is not defined and is not generated. The layout pattern of the capacitor device is automatically generated through the processing described above.

Next, parameters are automatically specified for the basic cell of the generated capacitor device. A parameter includes a parameter name and a parameter value. It is programmed to start layout pattern generation immediately when a parameter is changed. When a basic cell is generated, the default parameter values are the minimum values specified in the process technology definition table 31c. FIG. 20 is a diagram showing examples of parameters 41a of the layout pattern of the capacitor device. If the layout is designed by using a basic cell, the shape of the layout pattern can be changed by changing a parameter value specified for the basic cell. For example, if a specified type of capacitance specification is "Capacitance&Width" which is a type specifying a capacitance value and a layer width or "Capacitance&Height" which is a type specifying a capacitance value and a layer height, and if a capacitance parameter value is changed, an area is obtained from the value of unit capacitance "AreaCapacitor" between the layers to be formed in the process technology definition table, and the height or width parameter of the bottom layer is automatically calculated from the width or height of the bottom layer. In accordance with the specified parameter values, the layout pattern of the capacitor device is automatically changed.

Figure 21:
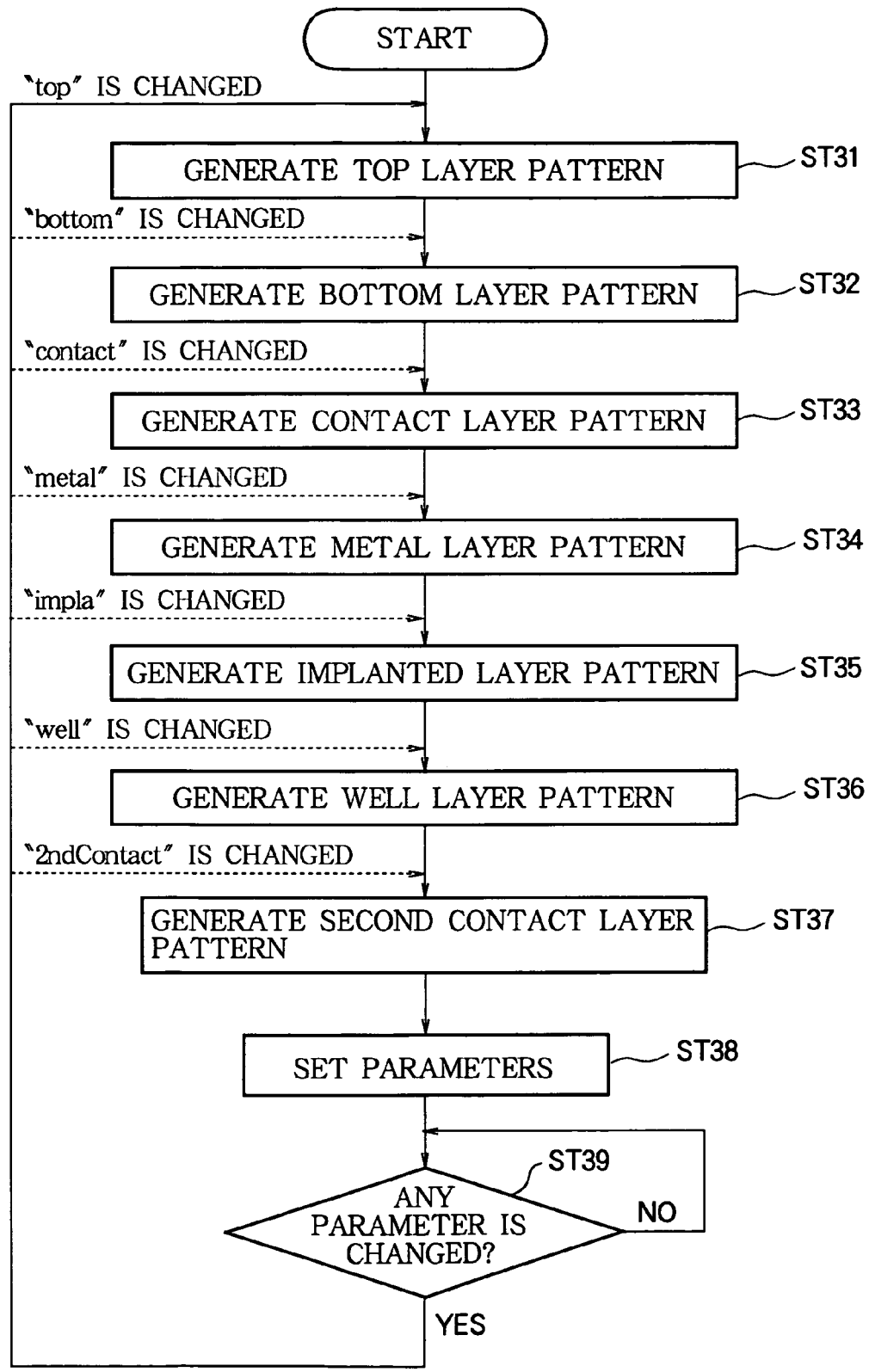
FIG. 21 is a flow chart showing a layout pattern generation process in the layout pattern generation method according to the third embodiment.

FIG. 21 is a flow chart showing an example of layout pattern generation step (step ST3 of FIG. 2) in the layout pattern generation method according to the third embodiment. As has been described above, in the layout pattern generation step ST3 of the layout pattern generation method according to the third embodiment, the top layer pattern is generated (step ST31), the bottom layer pattern is generated (step ST32), the contact layer pattern is generated (step ST33), the metal layer pattern is generated (step ST34), the ion implanted layer pattern is generated (step ST35), the well layer pattern is generated (step ST36), the second contact layer pattern "2ndContact" is generated (step ST37), and parameters are specified (step ST38). If a parameter is changed later (step ST39), pattern generation is performed from the step of the corresponding pattern As has been described above, according to the third embodiment, necessary data are obtained from the process technology definition file 21 defining the drawing standard based on the process technology related to the fabrication of the basic cell and necessary device structure data 32 are obtained from the device structure definition file 22c defining the device structure of the basic cell, and accordingly a pattern of a defined layer is automatically generated in accordance with a device template. Therefore, the layout pattern of the basic cell can be automatically generated without breaking the drawing standard, and the efficiency of layout design can be improved.

Further, since the layout patterns of the basic cells of different device structures can be generated by controlling the layer to be generated from the device structure definition file, by the same program of layout pattern generation, eliminating the need for creating a special automatic generation program, the manpower of program development is reduced. Also, since the layout patterns of basic cells of different processes can be generated early, without the need for developing a new program, the layout design can be started at an early stage.

Furthermore, if a drawing standard is changed when a new process is used, the layout pattern can be automatically changed by making a change to the process technology definition file and re-creating the basic cell of the capacitor. Therefore, the efficiency of changing the layout pattern is improved.

In addition, parameters are specified for the basic cell of a capacitor to be generated, and a layout pattern satisfying the drawing standard can be automatically changed by changing a parameter value. Accordingly, the manpower needed to change the layout can be reduced.

Fourth Embodiment

In the fourth embodiment, a case where a basic cell as an object, in which a layout pattern is generated, is a capacitor device will be described. In the fourth embodiment, the layout pattern of the inductor device can be automatically generated or changed in the same way as in the layout pattern generation method according to any of the first to third embodiments.

In the layout pattern generation method according to the fourth embodiment, the definition of the process technology definition file (21 in FIG. 2) is changed to that for an inductor device, and therefore the definition can be used to generate a layout pattern of the inductor device. A layer structure forming an inductor device of the basic cell such as a drawing standard of a layer and a drawing standard between layers are created for all the layers forming the layout pattern of the basic cell of the inductor device in the process technology definition file (21 in FIG. 2).

Figure 22B:
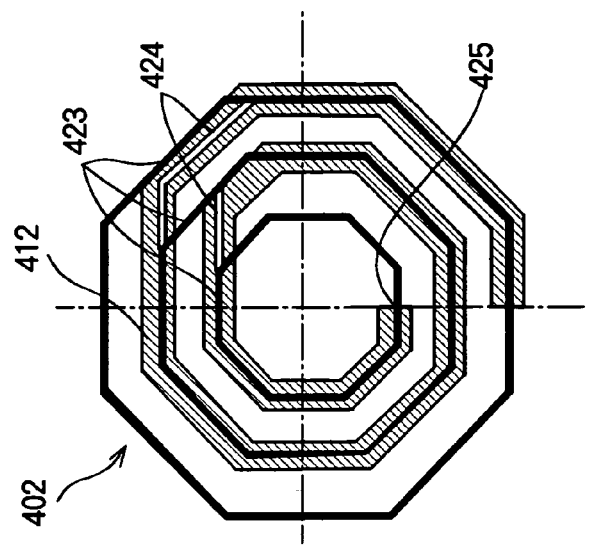
FIGS. 22A to 22C are diagrams showing contents (sample device templates) of the device structure definition file used in the layout pattern generation method according to the fourth embodiment.
Figure 22A:
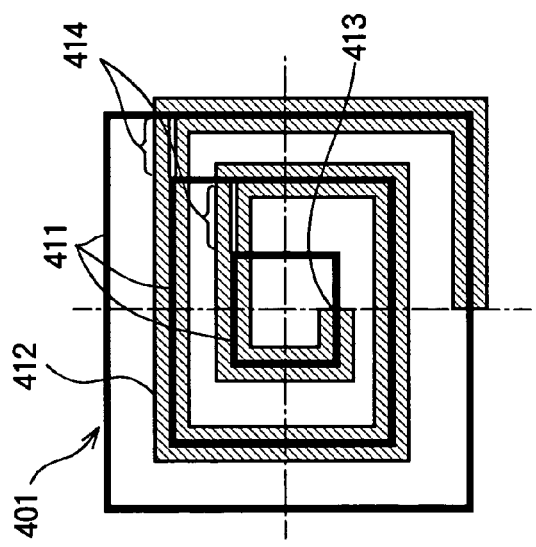
Figure 22C:
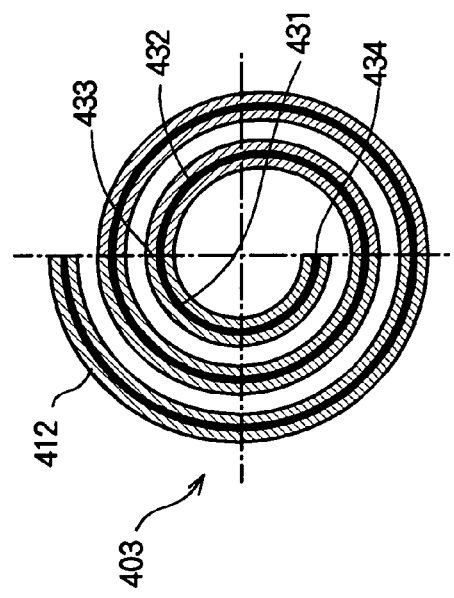

In addition, a drawing standard of layers forming a layout pattern of the basic cell of the inductor device is created and added to the process technology definition file (21 in FIG. 2). The inductor device has a volute pattern including one of a square-like path pattern, an octagon-like path pattern, and a circle-like path pattern. The device structure definition file (22 in FIG. 2) defines a shape type of the inductor device, a layer name used to form the inductor device, and initial values of inductor parameters of windings, an inside diameter, an inductor width, and an inductor spacing. FIG. 23 is a diagram showing an example of the definition of an inductor device in the device structure definition file. FIGS. 22A to 22C are diagrams showing sample volute shape types of the inductor device.

An inductor device includes a wiring line (also referred to as a "path pattern") having an inductor width of the inductor layer 412. Depending on each type of the inductor device, the shapes of the center lines of the respective path patterns are different.

When the device template includes a spiral square-like path pattern shown in FIG. 22A, there are a plurality of square center lines 411 of a square-like path pattern. One side of the innermost square center lines 411 is an inside diameter of the inductor device. The distance between the innermost square center line and the first outward square center line is given by {(inductor width)+(inductor spacing)}.

Values defined in the device structure definition file are used as the inductor width and the inductor spacing.

As shown in FIG. 22A, the center line of the path pattern is started from a start point 413 on the innermost square center line, advances clockwise, and bents at the obtained vertices. A shift to an outer square center line is made at a point (i.e., a shift point) 414 where an extension of the top side intersects with the outer square center line. The shift is made as many times as the number of inductor windings. The winding is counted in units of 0.25.

As shown in FIG. 22B, a center line of an octagonal device template is a center line 423 of the octagon-like path pattern. An inner diameter of an innermost octagonal center line is a distance between the bottom and top of the center lines of the innermost octagon-like path pattern. The distance between the innermost octagonal center line and the first outward octagonal center line is given by {(inductor width)+(inductor spacing)}.

On the center line of the path pattern, the vertices of an inner octagon-like path pattern are obtained clockwise from the start point 425. A shift to an outer octagon-like path pattern is made by making the octagon-like path pattern to move to the right by a distance given by {(inductor width)+(inductor spacing)}.

The top is extended to the top of the moved octagon-like path pattern, and a shift is made to the corresponding vertex of the moved top (shift side) 424 and to the next vertex, and the subsequent vertices are generated as vertices of the outer octagon-like path pattern as many as the number of inductor windings.

As shown in FIG. 22C, the diameter of the innermost half arc to the left of the center line of a circular device template is specified as the inside diameter of the inductor. The innermost left half arc 431 and a right half arc 432, a diameter of which is given by {(diameter of left half arc)+(inductor width) +(inductor spacing)}.

The innermost left half arc 431 and a right half arc 432 are joined at the top (i.e., a joining point) 433. A demarcation line becomes the center line of the path pattern, and a left half arc and a right half arc are formed with a spacing to the center line given by {(inductor width)+(inductor spacing)}, and the arcs are joined at the top. This combination is formed as many as the number of inductor windings, clockwise from the start point 434.

FIG. 23 shows an example of contents (e.g., layer names of layer structures of a device template) of the device structure definition file 22d, which corresponds to the device structure definition file 22 shown in FIG. 2, used in the layout pattern generation method according to the fourth embodiment.

The device structure definition file 22d shown in FIG. 23 includes the basic cell name to be defined (e.g., deviceType="Inductor") and layer names assigned to the layer structures of the device template. A layer name is assigned by specifying a layer needed to generate a layout pattern of the basic cell in accordance with the layers included in the device template and specifying a corresponding layer name in accordance with the process technology definition file 21. A layout pattern of the basic cell of each inductor is generated in accordance with a defined layer, an assigned layer name, and a drawing standard of the process technology related to the layer name.

Figures 24A, 24B, 25:
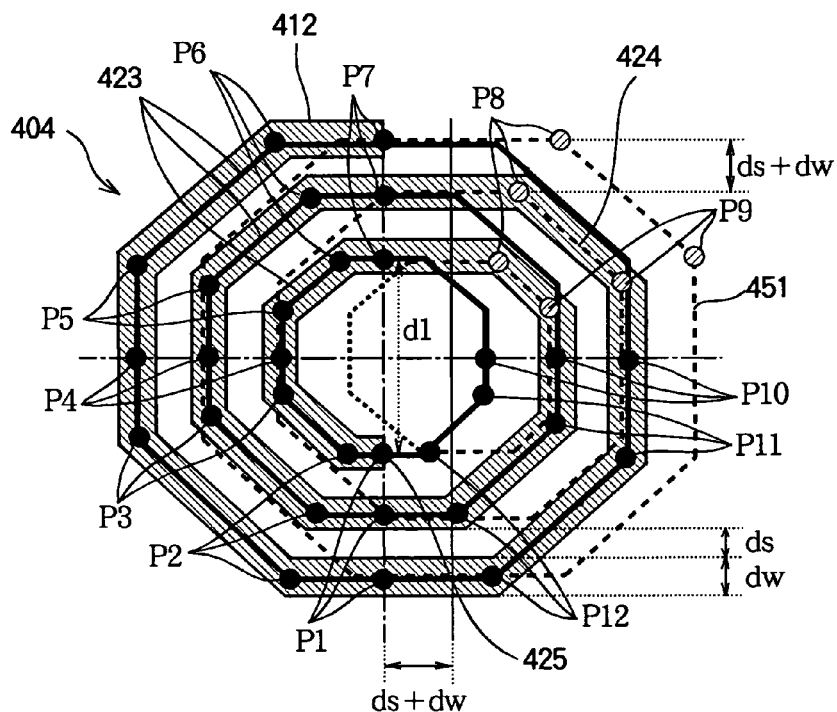
FIG. 24A is a diagram showing contents (layer names, minimum sizes, etc.) of the process technology definition table used in the layout pattern generation method according to the fourth embodiment.
FIG. 24B is a diagram showing contents (layer names and size of layer structures of the inductor device) of the device structure definition table used in the layout pattern generation method according to the fourth embodiment.
FIG. 25 is a diagram showing a layout pattern of an inductor device generated by the layout pattern generation method according to the fourth embodiment.

FIG. 24A is a diagram showing contents (e.g., layer name and its minimum size) of the process technology definition table 31d used in the layout pattern generation method according to the fourth embodiment. FIG. 24B is a diagram showing contents (e.g., layers of inductor device and their layer names) of the device structure definition table 32d used in the layout pattern generation method according to the fourth embodiment. FIG. 25 is a diagram showing a layout pattern 404 of an inductor device generated by the layout pattern generation method according to the fourth embodiment. FIGS. 24A and 24B and FIG. 25 shows examples of automatic layout pattern generation of an "octinductor" inductor device having a spiral octagon-like path pattern.

In layout pattern generation of the basic cell having a cell name of "octinductor" (i.e., cell="octinductor"), a layout pattern of an inductor is generated in accordance with the contents of the device structure definition table. In the shown example, the shape type is octagon, the inductor layer name is MET1, the inductor width is 'dw', the inside diameter of the inductor is 'dl', and the number of the windings is 2.5. The inductor spacing is not defined and is assumed to be the minimum spacing 'ds' of the MET1 layer in the process technology definition table by default.

It is checked that the inductor width is greater than the minimum width of the MET1 layer in the process technology definition table 31d and that the inside diameter of the inductor is greater than {(MET1 minimum width)+(minimum spacing)}.

If a smaller item is found, a value calculated from the process technology definition table is taken.

The vertices of the center line of the path pattern of the inductor are calculated, and a path pattern tracing the vertices is formed to generate a layout pattern.

First, a vertex of the innermost octagon-like path pattern at the inside diameter 'dl' of the inductor is obtained. Vertices P1 to P7 and P10 to P12 of the octagonal center line 423 are determined successively as many as the number of windings in such a manner that the spacing with respect to the center line is given by {(inductor width)+(inductor spacing)}.

The center line of the octagon-like path pattern is moved to the right by

{(inductor spacing ds)+(inductor width dw)}.

Vertices P8 and P9 of the moved center line 451 are obtained.

From the inner octagon-like path pattern, a path pattern connecting as many vertices as the number of windings are generated, with 0.25 winding at vertices P1 to P4 of the center line, 0.5 winding at vertices P5 to P7, vertices P8 and P9 of the center line of the shifted octagon-like path pattern, 0.75 winding at vertex P10 of the outer center line, one winding at vertices P12 and P1. Now, the layout pattern of the inductor is generated.

Parameters are automatically specified to the generated basic cell of the inductor. A parameter has a parameter name and a parameter value. It is programmed to start layout pattern generation immediately when a parameter is changed. When the basic cell is generated, default parameter values are specified. FIG. 26 is a diagram showing an example of parameters 41d of the layout pattern of an inductor device. When a parameter is changed, the program starts, the layout generation is executed, and the layout pattern is automatically changed.

Figure 27:
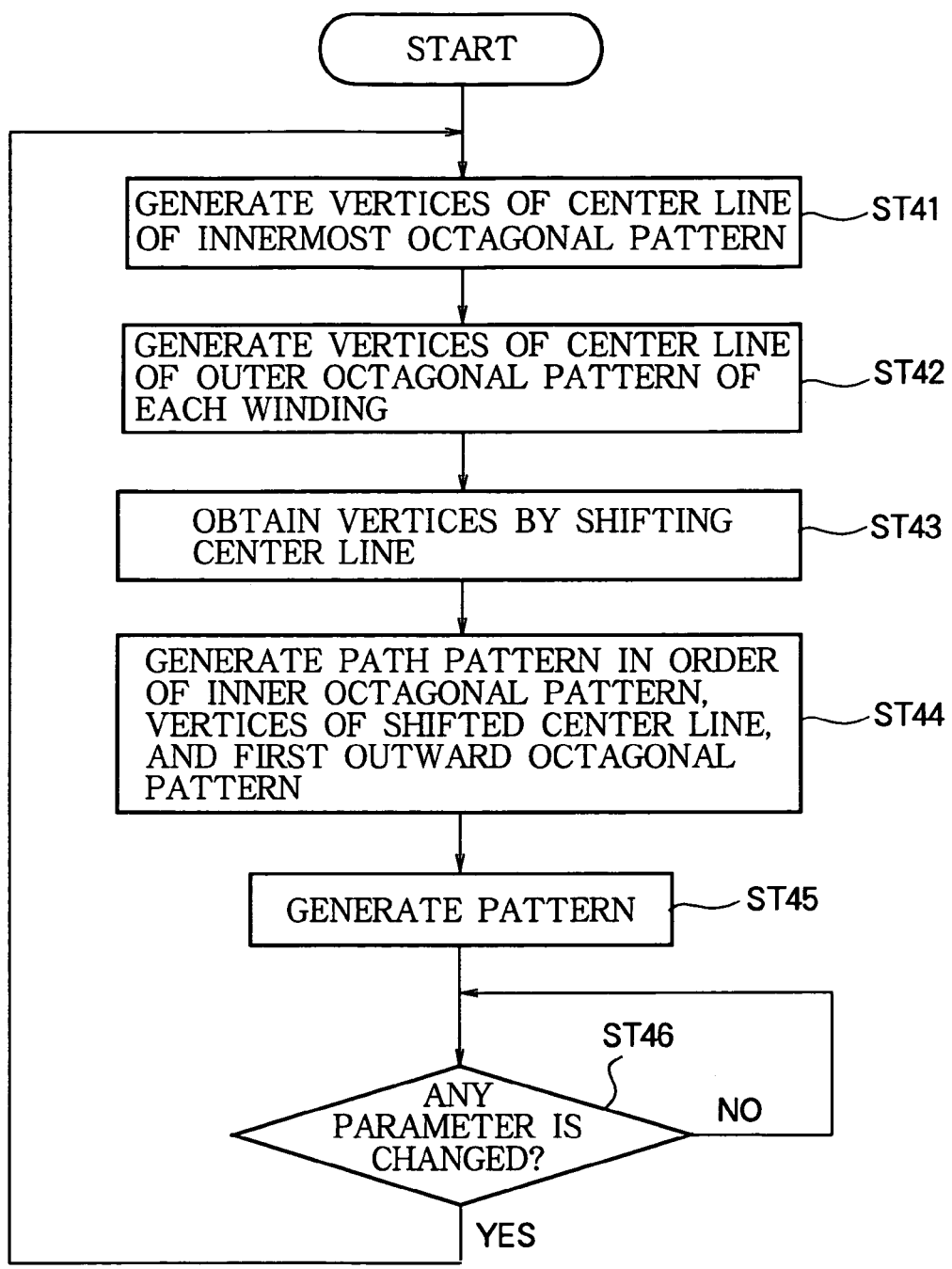
FIG. 27 is a flow chart showing a layout pattern generation process in the layout pattern generation method according to the fourth embodiment.

FIG. 27 is a flow chart showing an example of the layout pattern generation (step ST3 in FIG. 2) in the layout pattern generation method (using an octagonal device template) according to the fourth embodiment. As has been described above, in the layout pattern generation step ST3 of the layout pattern generation method according to the fourth embodiment, the vertices of the center line of the innermost octagon-like path pattern are obtained (step ST41), vertices of the center line of an outer octagon-like path pattern are obtained as many as the number of windings (step ST42), the center line is moved to the right and vertices are obtained (step ST43), a path pattern is generated by tracing the inner octagon-like path pattern, a vertex of the moved center line, vertex of a first outward center line, and vertices of the first outward center line in that order (step ST44), and parameters are specified (step ST45). If a parameter is changed later (step ST46), pattern generation is repeated.

As has been described above, according to the fourth embodiment, necessary data are obtained from the process technology definition file 21 defining the drawing standard based on the process technology related to the fabrication of the basic cell, necessary device structure data 32 are obtained from the device structure definition file 22d defining the device structure of the basic cell, and a pattern of a defined layer is automatically generated in accordance with the device template. Therefore, the layout pattern of the basic cell can be automatically generated without breaking the drawing standard and the efficiency of layout design can be improved.

Further, a layout pattern of an inductor device having a different shape can be automatically generated by controlling the shape and other parameters of the device structure definition file 22d.

Furthermore, if the drawing standard is changed when a new process is used, the layout pattern can be automatically changed by making a change to the process technology definition file 21 and the device structure definition file 22d and by re-creating the basic cell of the inductor. Therefore, the layout pattern can be changed at a higher efficiency.

In addition, parameters are specified to the basic cell of the inductor to be generated, and the layout pattern can be automatically changed to satisfy the drawing standard by changing the parameter. Therefore, the manpower needed to change the layout can be reduced.

The invention being thus described, it will be obvious that the same may be varied in many ways. Such variations are not to be regarded as a departure from the spirit and scope of the invention, and all such modifications as would be obvious to one skilled in the art are intended to be included within the scope of following claims.

What is claimed is:

1. A method for generating a layout pattern of a basic cell forming a semiconductor integrated circuit, the method comprising:

obtaining process technology definition data related to a process technology of each layer forming the basic cell as an object in which the layout pattern is generated, from a process technology definition file defining process technology definition data related to a process technology for use in fabricating a semiconductor integrated circuit, thereby holding a process technology definition table containing the obtained process technology definition data;

obtaining device structure data including data related to a device template which defines a structure of each layer of the basic cell as an object in which the layout pattern is generated and data related to the structure of each layer defined in accordance with the device template, from a device structure definition file defining the device structure data determined for each type of the basic cell forming the semiconductor integrated circuit, thereby holding the obtained device structure data as a device structure definition table; and determining the structure of each layer defined in accordance with the device template held as the obtained device structure data, in accordance with the process technology definition data of a corresponding layer in the process technology definition table, thereby generating the layout pattern of the basic cell forming the semiconductor integrated circuit.

2. The method according to claim 1, wherein the process technology definition table contains at least one of:

a minimum width of each layer forming the basic cell as an object in which the layout pattern is generated;

a minimum spacing between layers forming the basic cell as an object in which the layout pattern is generated;

a positional relationship between overlapping layers forming the basic cell as an object in which the layout pattern is generated;

a layer structure forming a unit resistor of the basic cell as an object in which the layout pattern is generated; and another layer structure forming a unit capacitor of the basic cell as an object in which the layout pattern is generated.

3. The method according to claim 1, wherein the basic cell as an object in which the layout pattern is generated is a transistor device, and the structure of each layer of the basic cell as an object in which the layout pattern is generated includes at least one of an ion implantation structure, a well structure, a terminal cover structure, and a contact structure.

4. The method according to claim 1, wherein
the basic cell as an object in which the layout pattern is generated is a resistor device, and
the structure of each layer of the basic cell as an object in which the layout pattern is generated includes at least one of an ion implantation structure, a guard ring structure, a contact structure, and a cover structure.

5. The method according to claim 1, wherein
the basic cell as an object in which the layout pattern is generated is a capacitor device, and
the structure of each layer of the basic cell as an object in which the layout pattern is generated includes at least one of a three-layer structure, an ion implantation structure, a well structure, and a contact structure.

6. The method according to claim 1, wherein
the basic cell as an object in which the layout pattern is generated is an inductor device,
a device template capable of defining the structure of each layer of the basic cell as an object in which the layout pattern is generated include a volute pattern, and
the data related to the structure of each layer defined in accordance with the device template includes data identifying a type of the volute pattern, a number of windings of the volute pattern, an inside diameter of the volute pattern, a width of the volute pattern, and a spacing of the volute pattern.

7. The method according to claim 6, wherein the volute pattern includes one of a square-like path, an octagon-like path, and a circle-like path.

8. The method according to claim 1, wherein
a parameter for controlling the layout pattern is generated and held in accordance with the layout pattern generated in the step of determining the structure of each layer, thereby generating the layout pattern; and
the held layout pattern can be changed by changing the parameter.

9. The method according to claim 1, wherein, when the process technology is changed or added in the process technology definition file, the steps of obtaining the process technology definition data, obtaining the device structure data, and determining the structure of each layer are executed again.

10. The method according to claim 1, wherein, when the device structure data is changed or added in the device structure definition file, the steps of obtaining the device structure data and determining the structure of each layer are executed again.

11. An apparatus for generating a layout pattern of a basic cell forming a semiconductor integrated circuit, the apparatus comprising:
a first storage for storing a process technology definition file defining process technology definition data related to a process technology for use in fabricating a semiconductor integrated circuit;
a second storage for storing a process technology definition table containing the process technology definition data related to a process technology of each layer forming the basic cell as an object in which the layout pattern is generated, the process technology definition data being obtained from the process technology definition file stored in the first storage;
a third storage for storing a device structure definition file defining device structure data determined for each type of the basic cell forming the semiconductor integrated circuit, the device structure data including data related to a device template which defines a structure of each layer of the basic cell and data related to the structure of each layer defined in accordance with the device template;
a fourth storage for storing the device structure data as a device structure definition table, the device structure data including data related to a device template which defines a structure of each layer of the basic cell as an object in which the layout pattern is generated and data related to the structure of each layer defined in accordance with the device template; and
a data processor determining the structure of each layer defined in accordance with the device template held as obtained device structure data, in accordance with the obtained process technology definition data of a corresponding layer in the process technology definition table, thereby generating the layout pattern of the basic cell forming the semiconductor integrated circuit.

12. The apparatus according to claim 11, wherein the process technology definition table contains at least one of:
a minimum width of each layer forming the basic cell as an object in which the layout pattern is generated;
a minimum spacing between layers forming the basic cell as an object in which the layout pattern is generated;
a positional relationship between overlapping layers forming the basic cell as an object in which the layout pattern is generated;
a layer structure forming a unit resistor of the basic cell as an object in which the layout pattern is generated; and
another layer structure forming a unit capacitor of the basic cell as an object in which the layout pattern is generated.

13. The apparatus according to claim 11, wherein
the basic cell as an object in which the layout pattern is generated is a transistor device, and
the structure of each layer of the basic cell as an object in which the layout pattern is generated includes at least one of an ion implantation structure, a well structure, a terminal cover structure, and a contact structure.

14. The apparatus according to claim 11, wherein
the basic cell as an object in which the layout pattern is generated is a resistor device, and
the structure of each layer of the basic cell as an object in which the layout pattern is generated includes at least one of an ion implantation structure, a guard ring structure, a contact structure, and a cover structure.

15. The apparatus according to claim 11, wherein
the basic cell as an object in which the layout pattern is generated is a capacitor device, and
the structure of each layer of the basic cell as an object in which the layout pattern is generated includes at least one of a three-layer structure, an ion implantation structure, a well structure, and a contact structure.

16. The apparatus according to claim 11, wherein
the basic cell as an object in which the layout pattern is generated is an inductor device,
a device template capable of defining the structure of each layer of the basic cell as an object in which the layout pattern is generated include a volute pattern, and
the data related to the structure of each layer defined in accordance with the device template includes data identifying a type of the volute pattern, a number of windings of the volute pattern, an inside diameter of the volute pattern, a width of the volute pattern, and a spacing of the volute pattern.

17. The apparatus according to claim 16, wherein the volute pattern includes one of a square-like path, an octagon-like path, and a circle-like path.

18. The apparatus according to claim 11, further comprising a fifth storage for holding the layout pattern generated in data processor and a parameter for controlling the layout pattern, the layout pattern held in the fifth storage being changed when an instruction to change the parameter is issued to the data processor.

19. The apparatus according to claim 11, wherein, when the process technology is changed or added in the process technology definition file, the data processor executes steps of obtaining the process technology definition data, obtaining the device structure data, and determining the structure of each layer.

20. The apparatus according to claim 11, wherein, when data related to the device structure is changed or added in the device structure definition file, the data processor executes again a step of obtaining data related to a device template and the structure of each layer defined in accordance with the device template, thereby holding the obtained data as device structure data, and generating the layout pattern.

* * * * *